(12) United States Patent
Sigamani

(10) Patent No.: US 11,848,616 B2
(45) Date of Patent: *Dec. 19, 2023

(54) THREE-PHASE LLC POWER SUPPLY CIRCUIT FOR HIGH VOLTAGE BUS INPUT

(71) Applicant: Astec International Limited, Kowloon (HK)

(72) Inventor: James Sigamani, Manila (PH)

(73) Assignee: Astec International Limited, Kowloon (HK)

( * ) Notice: Subject to any disclaimer, the term of this patent is extended or adjusted under 35 U.S.C. 154(b) by 0 days.

This patent is subject to a terminal disclaimer.

(21) Appl. No.: 18/155,365

(22) Filed: Jan. 17, 2023

(65) Prior Publication Data

US 2023/0155512 A1 May 18, 2023

Related U.S. Application Data

(63) Continuation of application No. 17/105,746, filed on Nov. 27, 2020, now Pat. No. 11,557,976.

(51) Int. Cl.
| | |
|---|---|
| *H02M 3/335* | (2006.01) |
| *H01F 27/24* | (2006.01) |
| *H02M 1/44* | (2007.01) |
| *H03K 3/037* | (2006.01) |
| *H03K 19/20* | (2006.01) |

(52) U.S. Cl.
CPC ........ *H02M 3/33569* (2013.01); *H01F 27/24* (2013.01); *H02M 1/44* (2013.01); *H03K 3/037* (2013.01); *H03K 19/20* (2013.01)

(58) Field of Classification Search
CPC .. H02M 3/33569; H02M 1/44; H02M 7/4815; H01F 27/24; H03K 3/037; H03K 19/20
See application file for complete search history.

(56) References Cited

U.S. PATENT DOCUMENTS

| | | | |
|---|---|---|---|
| 5,877,951 | A | 3/1999 | Mweene |
| 9,077,255 | B2 | 7/2015 | Fu et al. |
| 9,780,678 | B2 | 10/2017 | Adragna et al. |
| 10,069,397 | B2 | 9/2018 | Vaidya et al. |

(Continued)

OTHER PUBLICATIONS

Yang Jiao, et al.; Topology Evaluation and Comparison for Isolated Multilevel DC/DC Converter for Power Cell in Solid State Transformer; IEEE; 2019; 8 pages.

(Continued)

*Primary Examiner* — Adolf D Berhane

(57) ABSTRACT

A three-phase power supply circuit is provided. The power supply circuit includes three LLC resonant voltage convertors, three step-down transformers, and a bridge rectifier. Each step-down transformer includes a primary and secondary coil, and each primary and secondary coil has a first node and a second node. Each step-down transformer is electrically coupled with one of the three LLC resonant voltage convertors by the first and second nodes of the primary coils. The bridge rectifier is electrically coupled with the first node of the secondary coil of each of the three step-down transformers. The second nodes of the secondary coils of each of the three step-down transformers are electrically coupled together.

19 Claims, 20 Drawing Sheets

(56) References Cited

U.S. PATENT DOCUMENTS

| | | |
|---|---|---|
| 10,181,732 B2 | 1/2019 | Eckert et al. |
| 10,593,566 B2 | 3/2020 | Parrish et al. |
| 11,146,176 B2 | 10/2021 | Sigamani |
| 11,557,976 B2 * | 1/2023 | Sigamani .............. H02M 3/003 |
| 2009/0303753 A1 | 12/2009 | Fu et al. |
| 2014/0218973 A1 | 8/2014 | Popovici et al. |
| 2020/0007050 A1 | 1/2020 | Fu et al. |
| 2020/0228022 A1 | 7/2020 | Hu et al. |
| 2020/0366211 A1 | 11/2020 | Zhang et al. |

OTHER PUBLICATIONS

Zong et al.; Three-level Frequency-Doubling LLC Resonant Converter with High Step-down Ration for High Input Voltage Applications; IEEE; 2014; 6 pages.

* cited by examiner

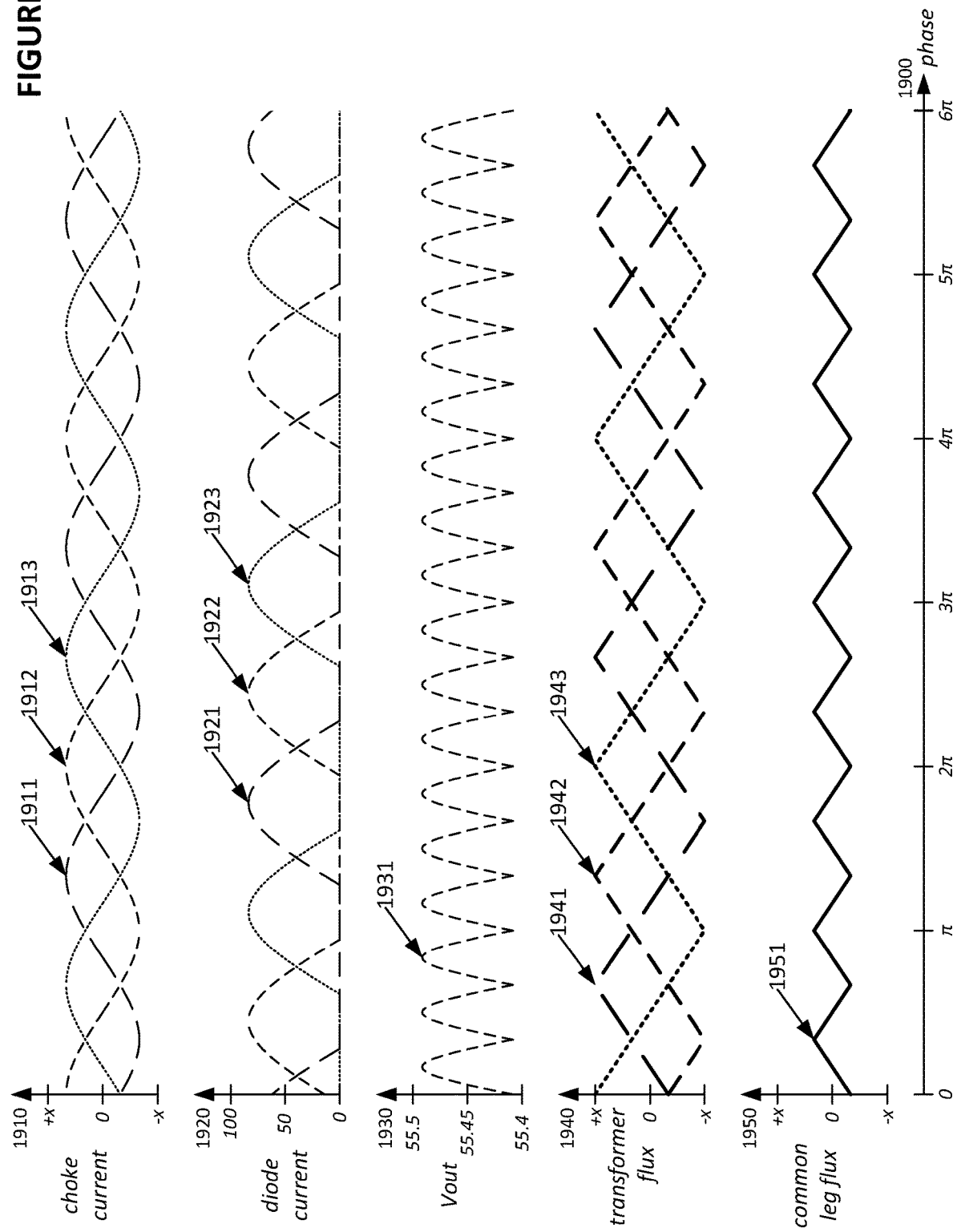

US 11,848,616 B2

THREE-PHASE LLC POWER SUPPLY CIRCUIT FOR HIGH VOLTAGE BUS INPUT

CROSS-REFERENCE TO RELATED APPLICATIONS

This application is a continuation to U.S. application Ser. No. 17/105,746 filed Nov. 27, 2020. The entire disclosure of the above application is incorporated herein by reference.

TECHNICAL FIELD

Aspects of the disclosure are related to electronic components and in particular to components for three-phase power systems.

TECHNICAL BACKGROUND

Three-phase LLC power converters are commonly used in a variety of systems including telecom systems, fast chargers for electric vehicles, and other applications requiring high power density and high efficiency.

These three-phase LLC power converters typically include an inductor/transformer pair for each of the three phases. Since these components must withstand large switching currents and voltage stresses, they are commonly among the largest components and most expensive within the power converter.

Overview

In an embodiment, a three-phase power supply circuit is provided. The power supply circuit includes three LLC resonant voltage convertors, three step-down transformers, and a bridge rectifier. Each step-down transformer includes a primary and secondary coil, and each primary and secondary coil has a first node and a second node. Each step-down transformer is electrically coupled with one of the three LLC resonant voltage convertors by the first and second nodes of the primary coils. The bridge rectifier is electrically coupled with the first node of the secondary coil of each of the three step-down transformers. The second nodes of the secondary coils of each of the three step-down transformers are electrically coupled together.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

FIG. 19 illustrates exemplary magnetic fluxes within each of the transformers and inductors and a common return leg within an exemplary power supply circuit incorporating the three-phase magnetics assembly of FIGS. 18A and 18B.

DETAILED DESCRIPTION

The example embodiments described herein illustrate different methods for constructing a three-phase power supply circuit including three LLC resonant voltage convertors suitable for high voltage direct current (DC) inputs. Each LLC resonant voltage convertor is coupled with a step-down transformer, and the secondary coils of the three step-down transformers are electrically coupled together in a star formation. This configuration reduces switching current, voltage stress, and transformer primary root mean square (RMS) currents, resulting in improved efficiency.

Figure 1:
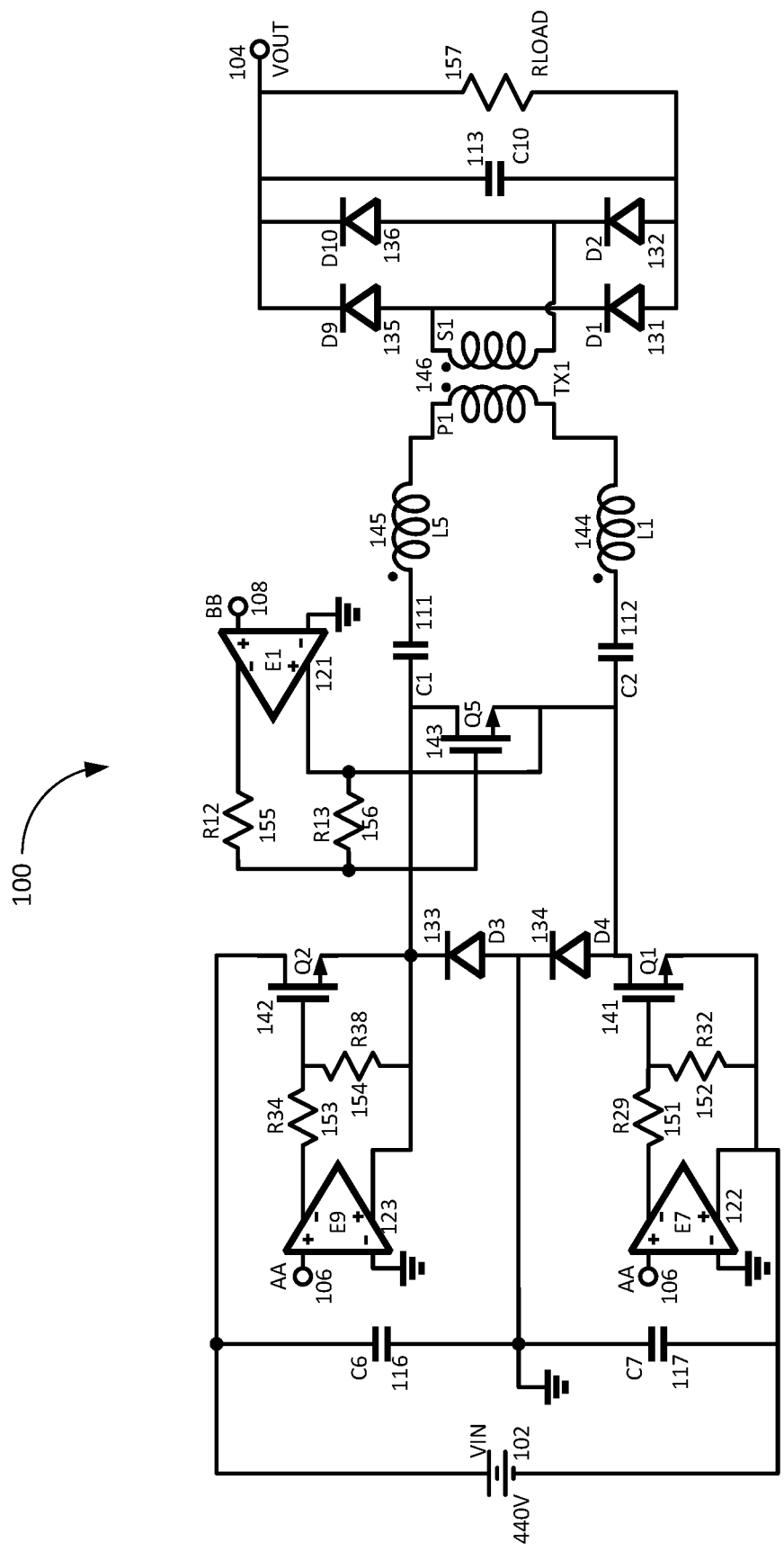
FIG. 1 illustrates an exemplary single-phase LLC resonant voltage convertor.

FIG. 1 illustrates an exemplary single-phase LLC resonant voltage convertor 100. In this example embodiment, input voltage VIN 102 is applied to inputs of the voltage convertor across capacitors C6 116 and C7 117 which act to divide the input voltage VIN 102 in half since the values of C6 116 and C7 117 are the same. In some example embodiments input voltage VIN 102 may be provided by a power factor correction circuit.

Switch Q1 141 and diode D4 134 make up a first half-bridge across C7 117 within the voltage convertor and switch Q2 142 and diode D3 133 make up a second half-bridge across C6 116 within the voltage convertor. Diodes D3 133 and D4 134 are blocking diodes which block current when switches Q1 141 and Q2 142 are turned on simultaneously. Switch Q1 141 is driven by isolated driver E7 122 and resistors R29 151 and R32 152. Switch Q2 142 is driven by isolated driver E9 123 and resistors R34 153 and R38 154. Isolated drivers E7 122 and E9 123 are both driven by square wave AA 106 which is generated by a control circuit illustrated in FIG. 2 and described in detail below.

The maximum voltage stress on switches Q1 141 and Q2 142 is equal to half of the input voltage VIN 102, or the voltage across capacitors C6 116 and C7 177 respectively, while switch Q5 143 experiences the entire voltage stress of input voltage VIN 102. In an example embodiment, when the input voltage VIN 102 is 440 volts as illustrated here, switches Q1 141 and Q2 142 may be rated for 300-400 volts, while Q5 143 is rated for 600-650 volts.

Switch Q5 143 is configured to short diodes D3 133 and D4 134 when it is activated by isolated driver E1 121 and resistors R12 155 and R13 156. Isolated driver E1 121 is driven by square wave BB 108 which is generated by a control circuit illustrated in FIG. 2 and described in detail below.

Each half-bridge drives one node of the primary P1 coil of step-down transformer TX1 146 through a capacitor/inductor pair. The first half-bridge comprising switch Q1 141 and diode D4 134 drives a first node of the primary P1 coil of step-down transformer TX1 146 through split resonant components capacitor C2 112 and inductor L1 144, electrically coupled in series. The second half-bridge comprising switch Q2 142 and diode D3 133 drives a second node of the primary P1 coil of step-down transformer TX1 146 through split resonant components capacitor C1 111 and inductor L5 145, electrically coupled in series.

In other example embodiments, a single resonant tank comprising C1 111 and L5 145 may be used, in which case the value of C1 111 will be half of the value required by the split arrangement illustrated in FIG. 1, and the value of L5 145 will be double the value required by the split arrangement illustrated in FIG. 1.

In this example embodiment, the secondary S1 coil of step-down transformer TX1 146 drives a bridge rectifier comprising diodes D1 131, D2 132, D9 135, and D10 136. The output of the bridge rectifier produces output voltage VOUT 104 across output filter capacitor C10 113 driving load resistance RLOAD 157.

Figure 14:
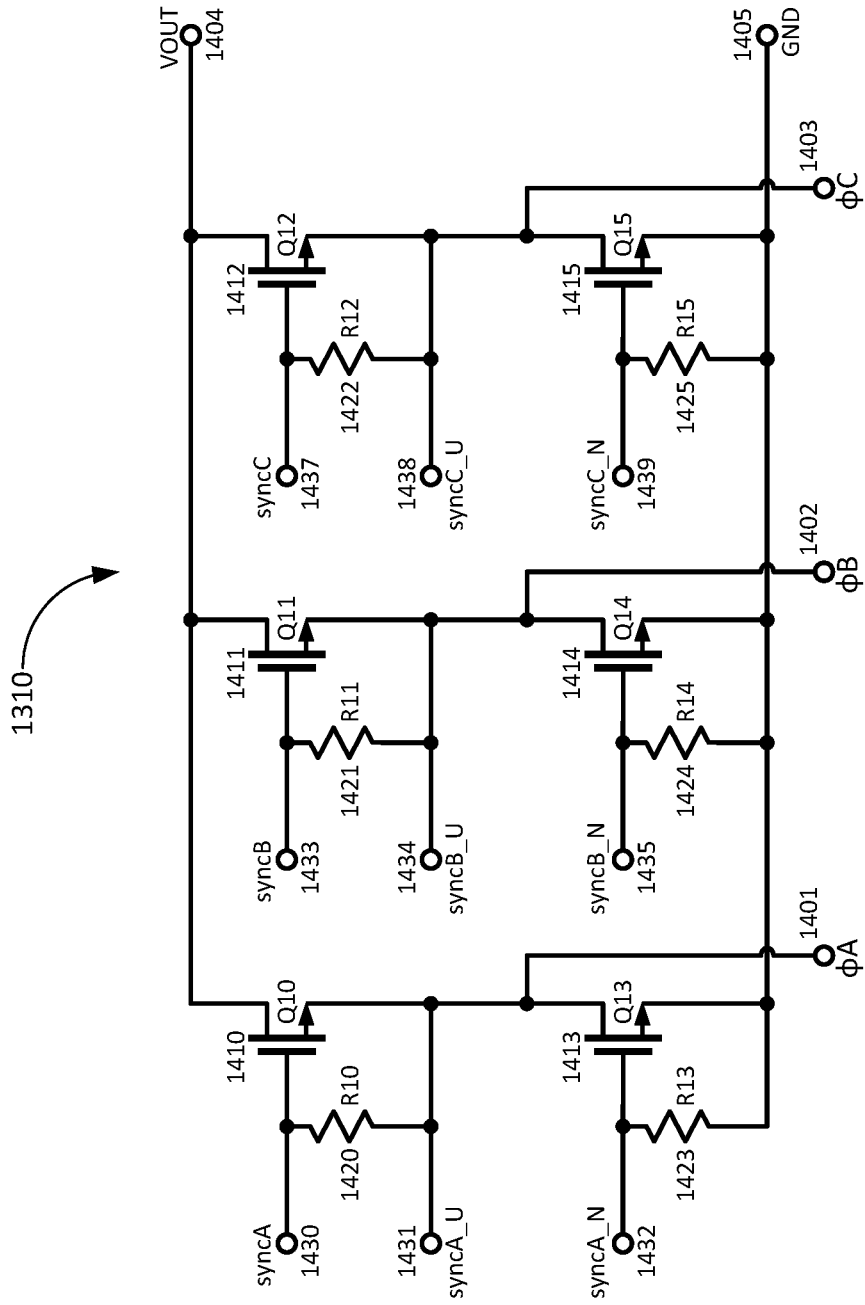
FIG. 14 illustrates an exemplary synchronous bridge rectifier including six switches.

In other example embodiments, synchronous rectifiers may be used in place of diodes D1 131, D2 132, D9 135, and D10 136. This embodiment is illustrated in FIG. 14 and described in detail below.

Figure 2:
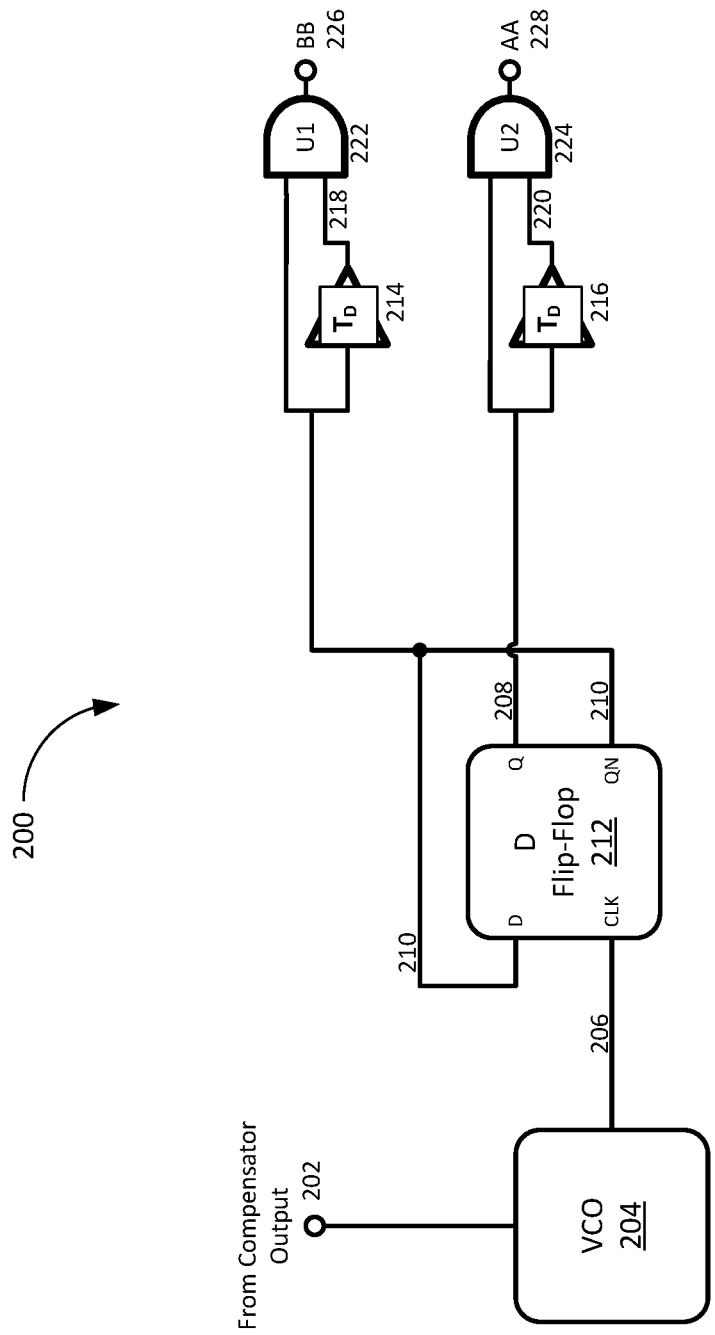
FIG. 2 illustrates an exemplary control circuit of the single-phase LLC resonant voltage convertor of FIG. 1.

FIG. 2 illustrates an exemplary control circuit 200 of the single-phase LLC resonant voltage convertor 100 of FIG. 1. In this example embodiment, control circuit 200 comprises voltage-controlled oscillator 204, D flip-flop 212, delay circuits 214 and 216, and two-input AND gates U1 222, and U2 224.

VCO 204 receives a voltage input 202 from a compensator circuit output (not illustrated) and outputs clock 206 to the CLK input of D flip-flop 212. D flip-flop 212 acts to divide the frequency of clock 206 from VCO 204 in half.

Output Q 208 of D flip-flop 212 drives an input of first delay circuit 216 and a first input of first AND gate U2 224. The output 220 of first delay circuit 216 drives the second input of first AND gate U2 224. Inverted output QN 210 of D flip-flop 212 drives the D input of D flip-flop 212 along with an input of second delay circuit 214 and a first input of second AND gate U1 222. The output 218 of second delay circuit 214 drives the second input of second AND gate U1 222.

First AND gate U2 224 provides control signal AA 228, and second AND gate U1 222 provides control signal BB 226. These control signals are provided to the LLC resonant voltage convertor 100 of FIG. 1 and are configured to control the three switches, Q1 141, Q2 142, and Q5 143, within LLC resonant voltage convertor 100. In this example embodiment, control signal AA 228 drives isolated drivers E7 122 and E9 123 which in turn control switches Q1 141 and Q2 142 respectively. Control signal BB 226 drives isolated driver E1 121 which in turn controls switch Q5 142.

Figure 3:
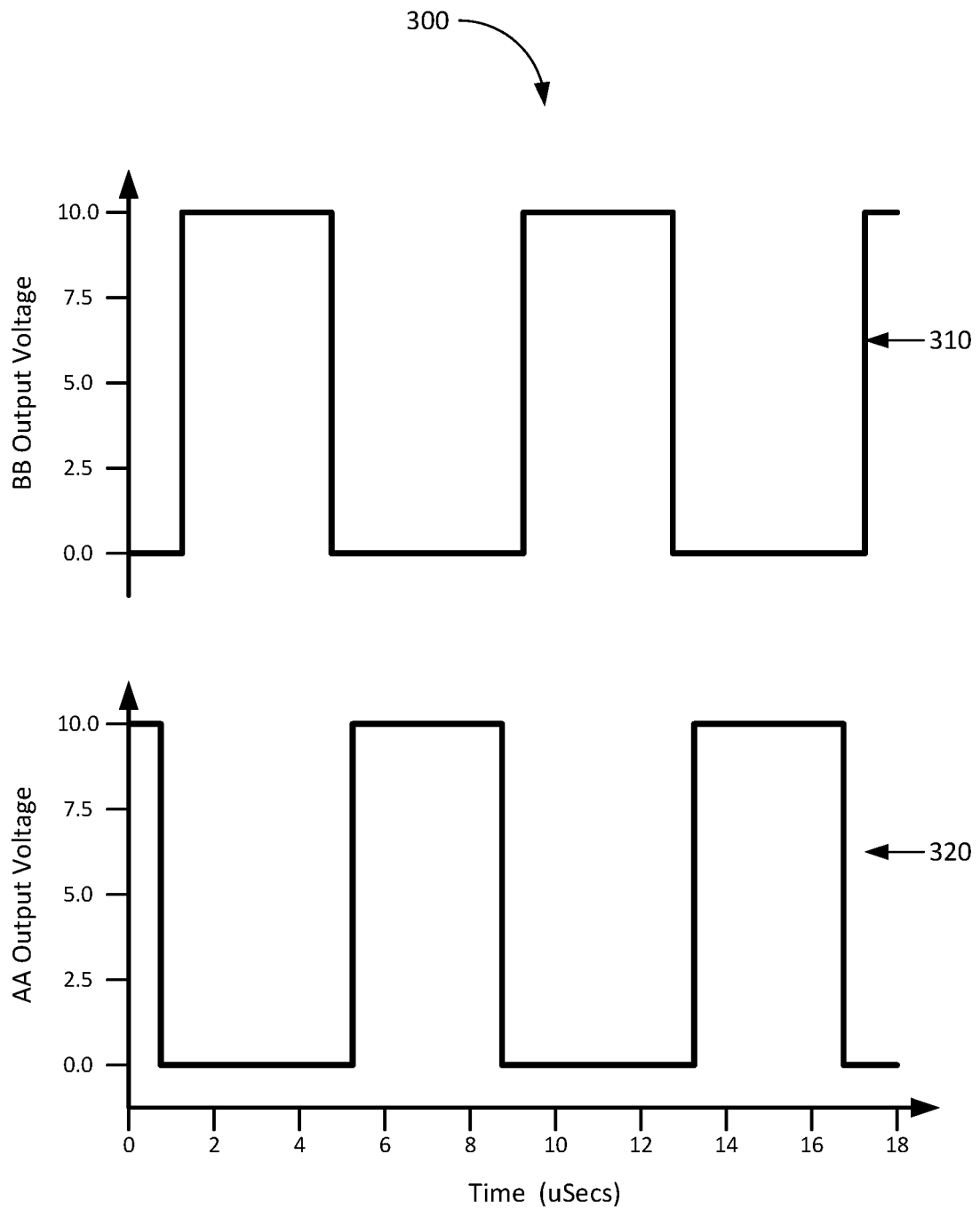
FIG. 3 illustrates exemplary non-overlapping square wave outputs from the control circuit of FIG. 2.

FIG. 3 illustrates exemplary non-overlapping square wave outputs 300 from the control circuit 200 of FIG. 2. This timing diagram illustrates outputs AA 320 from first AND gate U2 224, and BB 310 from second AND gate U1 222 from FIG. 2. Note that the voltages and times illustrated here are exemplary, and various embodiments of the present invention may provide square wave signals of various amplitudes and frequencies all within the scope of the present invention.

Figure 4:
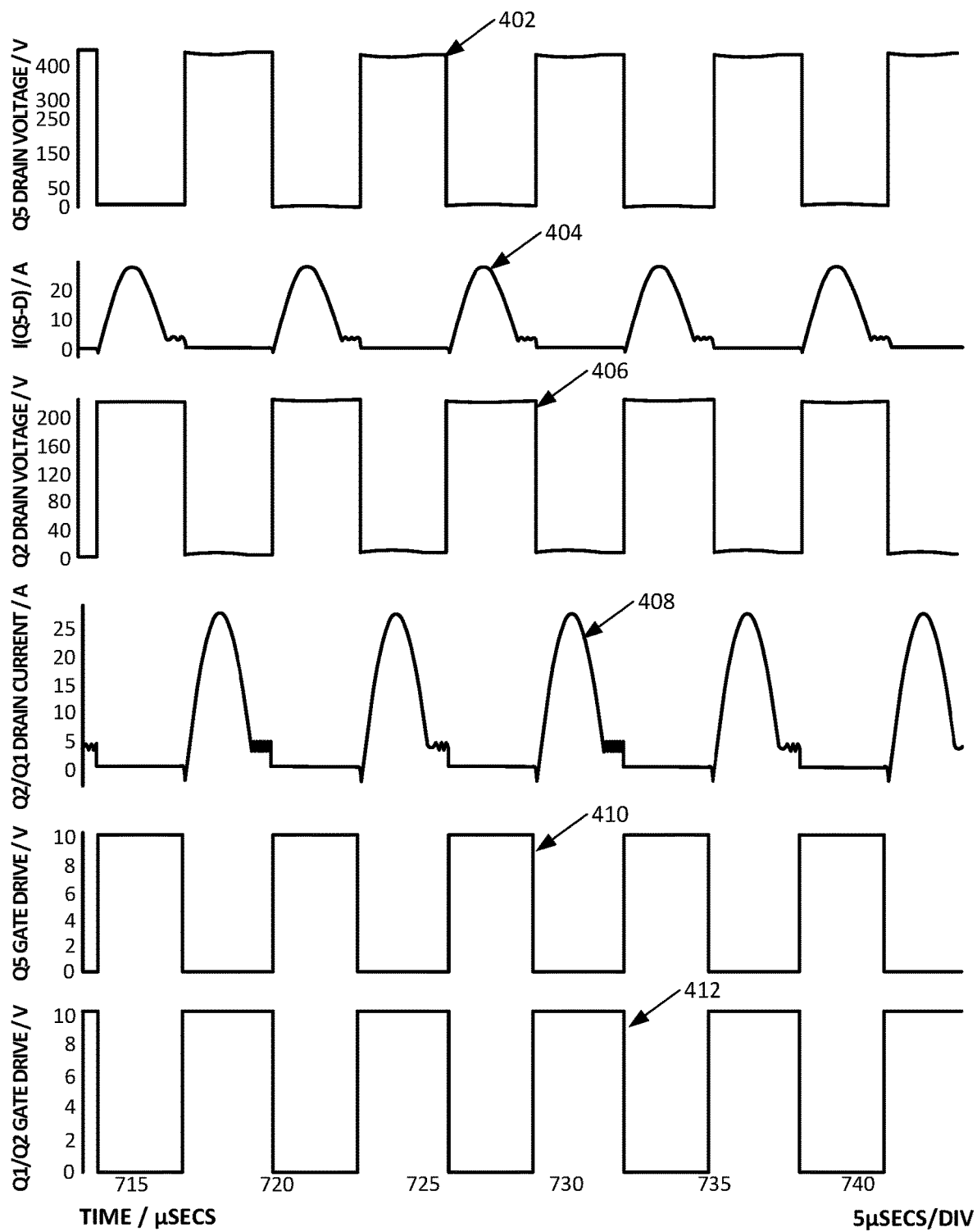
FIG. 4 illustrates exemplary voltages and currents within components of the single-phase LLC resonant voltage convertor of FIG. 1 when controlled by the control circuit of FIG. 2.

FIG. 4 illustrates exemplary voltages and currents within components of the single-phase LLC resonant voltage convertor 100 of FIG. 1 when controlled by the control circuit 200 of FIG. 2.

In this example embodiment, waveforms for the drain voltage 402 of Q5 143, current 404 of Q5 143, drain voltage 406 of Q1 141 and Q2 142, drain current 408 of Q1 141 and Q2 142, gate voltage 410 of Q5 143, and gate voltage 412 of Q1 141 and Q2 142 are illustrated.

Note that the voltages, currents, and times illustrated here are exemplary, and various embodiments of the present invention may produce waveforms of various amplitudes and frequencies all within the scope of the present invention.

Figure 5:
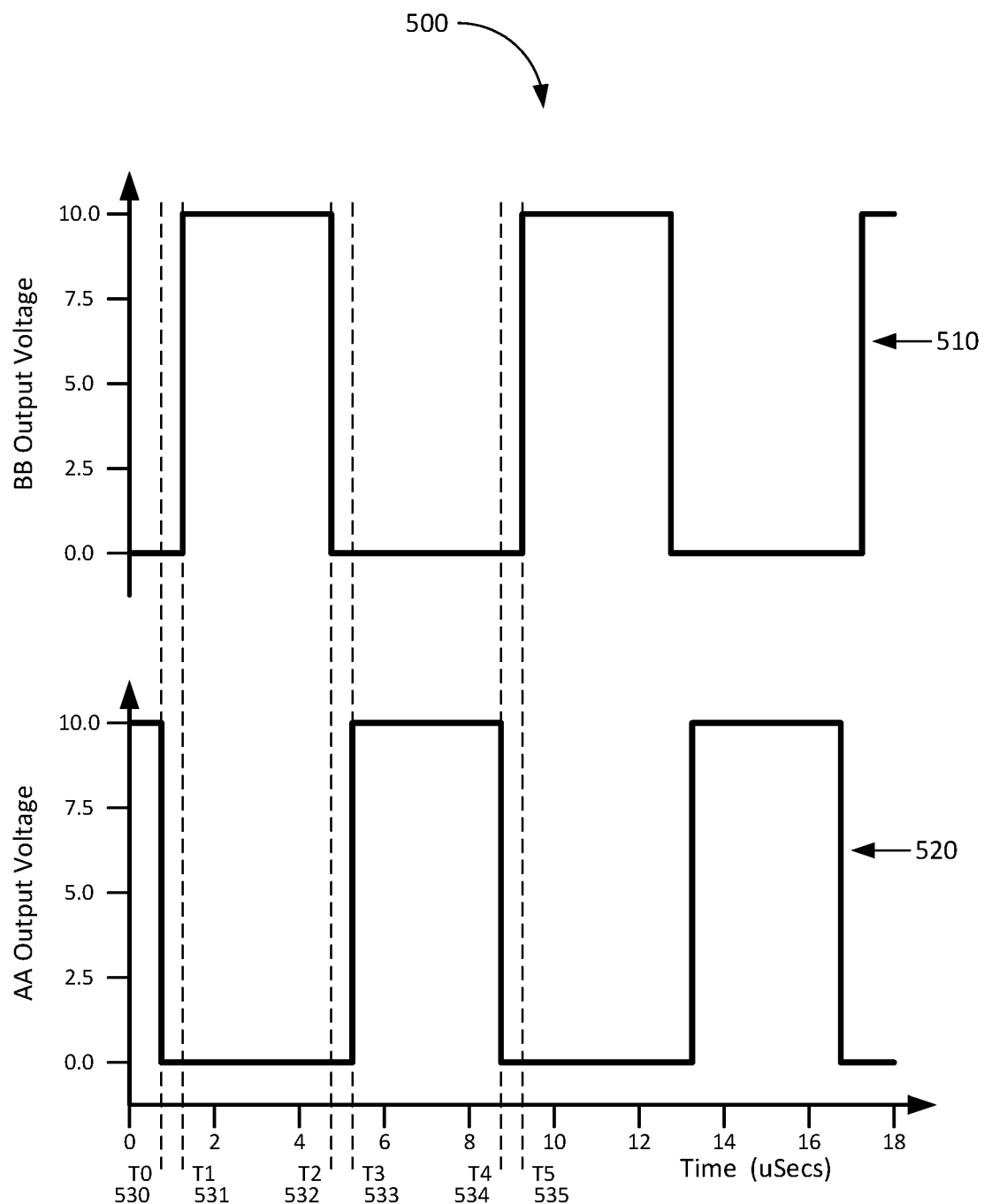
FIG. 5 illustrates the exemplary non-overlapping square wave outputs from the control circuit of FIG. 2.

FIG. 5 illustrates the exemplary non-overlapping square wave outputs AA 228 and BB 226 from the control circuit 200 of FIG. 2.

In operation, initially AA 228 is high Q1 141 and Q2 142 are conducting and delivering power to the output. At an exemplary time of T0 530, both Q1 141 and Q2 142 are turned off. If the switching frequency is less than the resonant frequency, the current through switches Q1 141 and Q2 142 will be equal to the magnetizing current (Imag) of the transformer TX1 146.

When switches Q1 141 and Q2 142 are turned off, Imag charges the output capacitances of Q1 141 and Q2 142 while the output capacitance (Coss) of Q5 143, and diodes D3 133 and D4 134, will discharge. Once the output capacitance (Coss) of Q5 143 is completely discharged its body diode turns on and the magnetizing current flows through this diode. If Q5 143 is turned on at this time, zero-voltage switching (ZVS) may be achieved.

If the switching frequency is higher than the resonant frequency, then the current through the switches will be higher than Imag depending on the load and the charge and discharge will be faster allowing smaller dead time to achieve ZVS.

At time T1 531, Q5 143 is turned on when its body diode is in conduction. C1 111, C2 112, L1 144, and L5 145 resonate, delivering power to the primary coil P1 of transformer TX1 146.

At time T2 532, Q5 143 is turned off. As before, Imag charges the output capacitance of Q5 143 and the junction capacitance of diodes D3 144 and D4 134 while discharging the output capacitances (Coss) of Q1 141 and Q2 142. Once switch Q5 143 is fully charged Imag flows through switches Q1 141 and Q2 142.

At time T3 533, switches Q1 141 and Q2 142 are turned on while their body diodes are conducting, achieving zero-voltage switching (ZVS).

This cycle repeats at times T4 534 and T5 535 corresponding to times T0 530 and T1 531 respectively.

Note that the voltages and times illustrated here are exemplary, and various embodiments of the present invention may provide square wave control signals of various amplitudes and frequencies all within the scope of the present invention.

Figure 6:
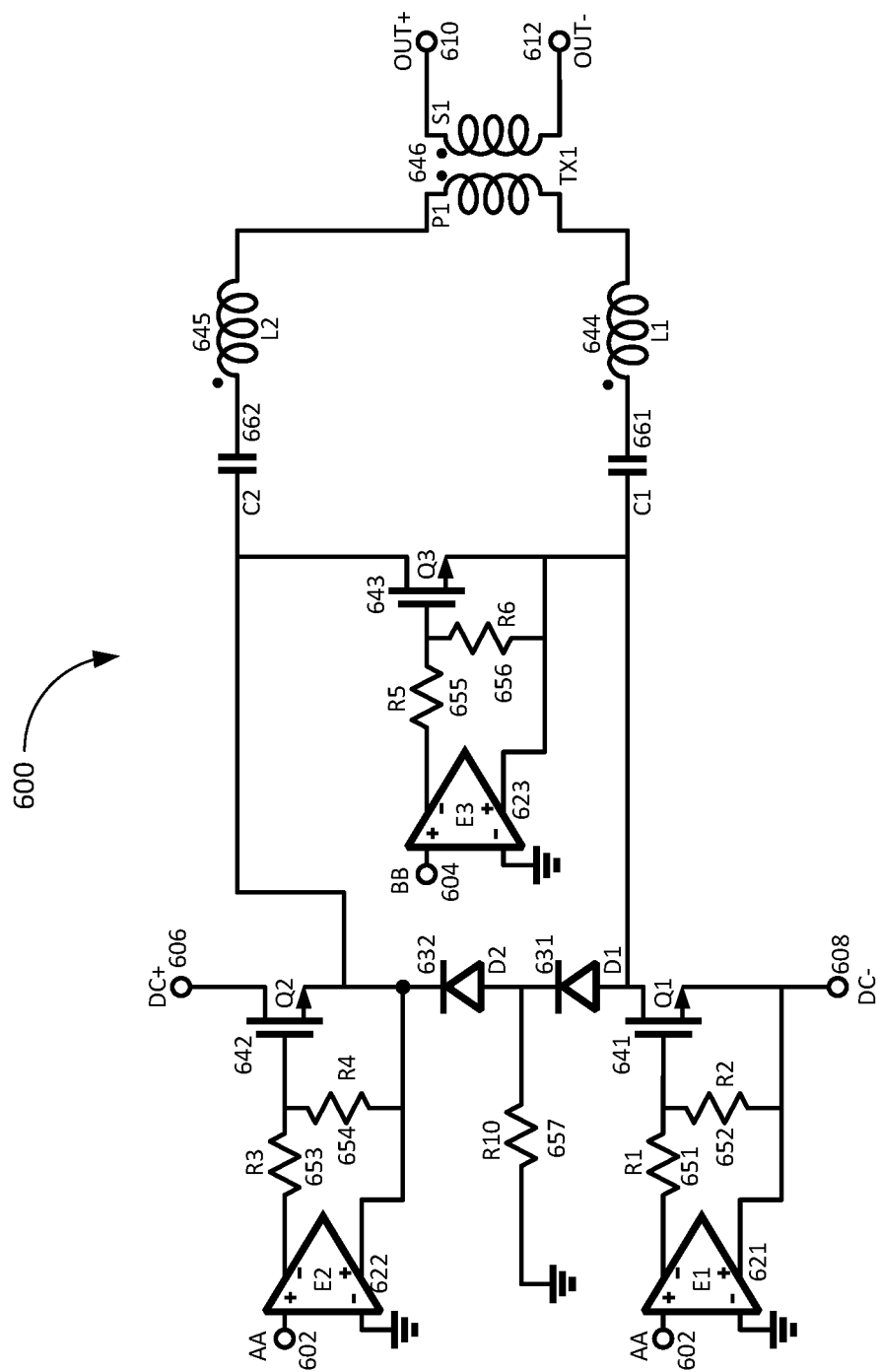
FIG. 6 illustrates an exemplary single-phase LLC resonant voltage convertor.

FIG. 6 illustrates an exemplary single-phase LLC resonant voltage convertor 600. This three-switch single-phase LLC resonant voltage convertor 600 is very similar to the voltage convertor 100 of FIG. 1.

In this example embodiment, an input voltage is applied to inputs DC+ 606 and DC− 608 of the voltage convertor 600. In some example embodiments the input voltage may be provided by a power factor correction circuit.

Switch Q1 641 and diode D1 631 make up a first half-bridge and switch Q2 642 and diode D2 632 make up a second half-bridge. Diodes D1 631 and D2 632 are blocking diodes which block current when switches Q1 641 and Q2 642 are turned on simultaneously. Resistor R10 657 to ground is included between diodes D1 631 and D2 632.

Switch Q1 141 is driven by isolated driver E1 621 and resistors R1 651 and R2 652. Switch Q2 642 is driven by isolated driver E3 622 and resistors R3 653 and R4 654. Isolated drivers E1 621 and E2 622 are both driven by square wave AA 602 which is generated by a control circuit illustrated in FIG. 8 and described in detail below.

The maximum voltage stress on switches Q1 641 and Q2 642 is equal to half of the input voltage between DC+ 606 and DC− 608, while switch Q3 643 experiences the entire voltage stress of the input voltage between DC+ 606 and DC− 608. In an example embodiment, when the input voltage between DC+ 606 and DC− 608 is 440 volts, switches Q1 641 and Q2 642 may be rated for 300-400 volts, while Q3 643 is rated for 600-650 volts.

Switch Q3 643 is configured to short diodes D1 631 and D2 632 when it is activated by isolated driver E3 623 and resistors R5 655 and R6 656. Isolated driver E3 623 is driven by square wave BB 604 which is generated by a control circuit illustrated in FIG. 8 and described in detail below.

Each half-bridge drives one node of the primary P1 coil of step-down transformer TX1 646 through a capacitor/inductor pair. The first half-bridge comprising switch Q1 641 and diode D1 631 drives a first node of the primary P1 coil of step-down transformer TX1 646 through split resonant components capacitor C1 661 and inductor L1 644, electrically coupled in series. The second half-bridge comprising switch Q2 642 and diode D2 632 drives a second node of the primary P1 coil of step-down transformer TX1 646 through split resonant components capacitor C2 662 and inductor L2 645, electrically coupled in series.

Figure 15:
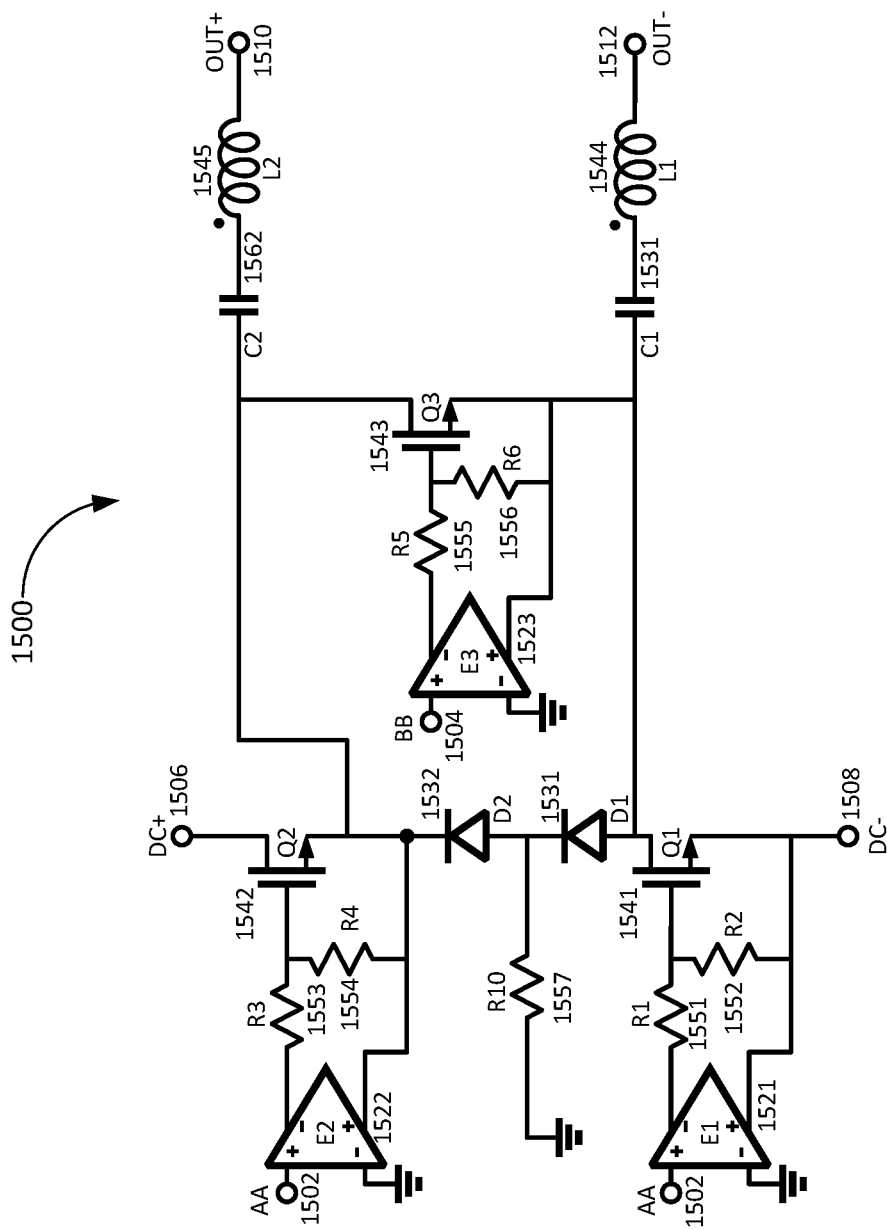
FIG. 15 illustrates an exemplary single-phase LLC resonant voltage convertor for use within the three-phase power supply circuit of FIG. 13.

Output voltages OUT+ 610 and OUT− 612 are provided on first and second nodes of the secondary coil S1 of step-down transformer TX1 646. While this example embodiment includes step-down transformer TX1 646 within LLC resonant voltage convertor 600, other embodiments may provide step-down transformer TX1 646 external to LLC resonant voltage convertor 600 as is illustrated by FIG. 15 and described in detail below.

In other example embodiments, a single resonant tank comprising C2 662 and L2 645 may be used, in which case the value of C2 662 will be half of the value required by the split arrangement illustrated in FIG. 6, and the value of L2 645 will be double the value required by the split arrangement illustrated in FIG. 6.

Figure 7:
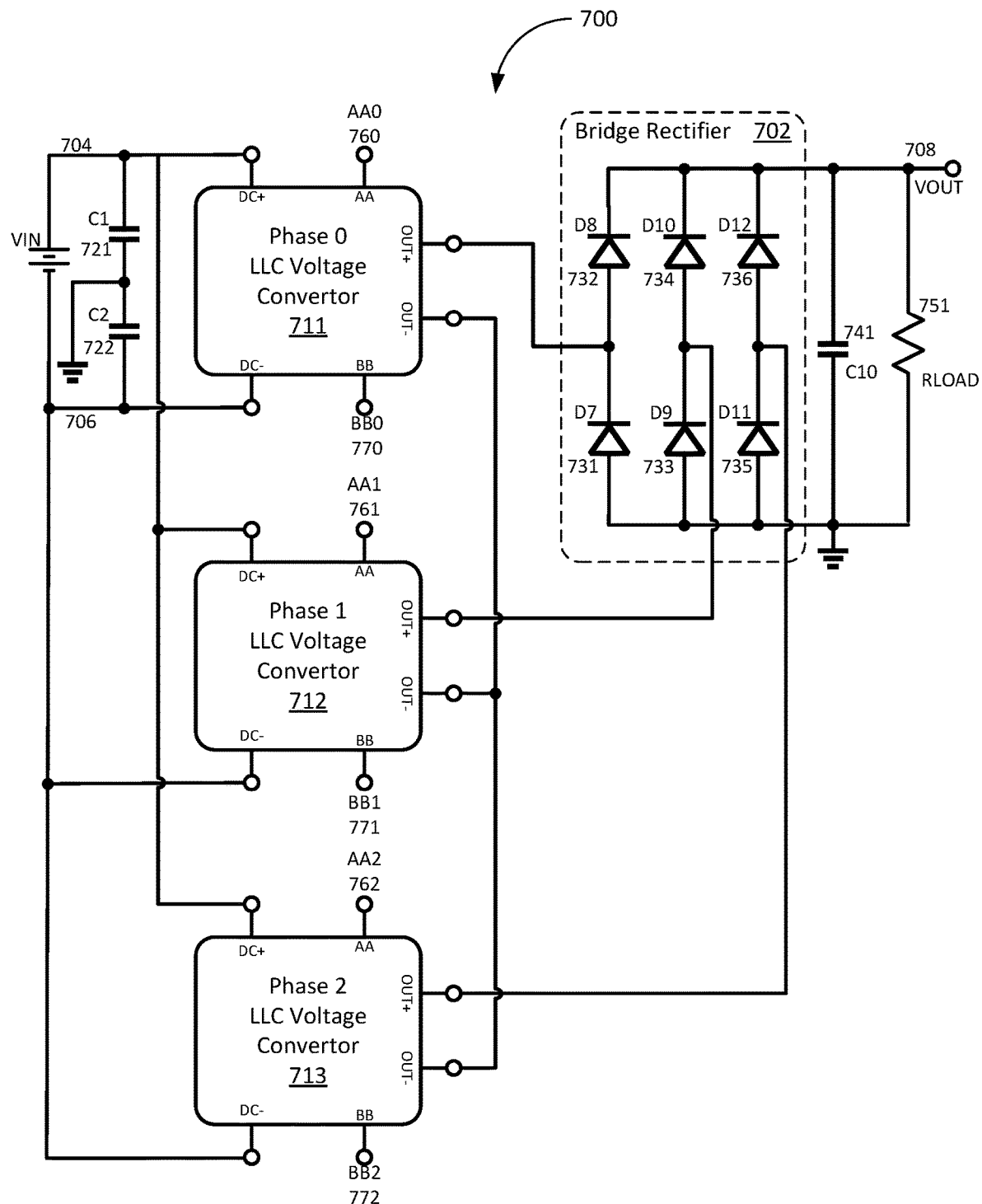
FIG. 7 illustrates an exemplary three-phase power supply circuit including three LLC resonant voltage convertors.

FIG. 7 illustrates an exemplary three-phase power supply circuit 700 including three LLC resonant voltage convertors 600 from FIG. 6. This example power supply circuit 700 comprises three LLC resonant voltage convertors 711, 712, and 713, such as the LLC resonant voltage convertor 600 of FIG. 6.

Input voltage VIN is applied to the DC+ 704 and DC− 706 inputs of each of the three LLC resonant voltage convertors 711, 712, and 713. VIN is applied to the DC+ and DC− inputs of the voltage convertors 711, 712, and 713 across capacitors C1 721 and C2 722, which act to divide the input voltage VIN in half since the values of C1 721 and C2 722 are the same.

Control signals AA0 760 and BB0 770 are provided to Phase 0 LLC voltage convertor 711. Control signals AA1 761 and BB1 771 are provided to Phase 1 LLC voltage convertor 712. Control signals AA2 762 and BB2 772 are provided to Phase 2 LLC voltage convertor 713. These six control signals are generated by a control circuit illustrated in FIG. 8 and described in detail below.

The OUT+ outputs (from a first node of the secondary coils of the step-down transformers) of voltage convertors 711, 712, and 713 are provided to bridge rectifier 702, while the OUT− outputs (from a second node of the secondary coils of the step-down transformers) of voltage convertors 711, 712, and 713 are electrically coupled together in a star formation. In this example embodiment, the OUT+ outputs of voltage convertors 711, 712, and 713 are the dot endings (or start of the secondary windings) of the step-down transformers, while the OUT− outputs of voltage convertors 711, 712, and 713 are the finish endings of the step-down transformers.

Since the secondary coils of the three step-down transformers are connected in a star formation, the phase-to-phase voltage is double that of one phase with respect to the star point. Thus, the transformer primary to secondary ratio needed at the resonant frequency for the same output voltage is double that of the single-phase LLC.

The start endings of the step-down transformers are connected to the midpoint of each leg of the three-phase diode bridge rectifier 702.

In this example embodiment, bridge rectifier 702 comprises diodes D7 731, D8 732, D9 733, D10 734, D11 735, and D12 736. In other example embodiments, synchronous rectifiers may be used in place of diodes D7 731, D8 732, D9 733, D10 734, D11 735, and D12 736. This embodiment is illustrated in FIG. 14 and described in detail below.

The output of bridge rectifier 702 produces output voltage VOUT 708 across output filter capacitor C10 741 driving load resistance RLOAD 751.

Figure 8:
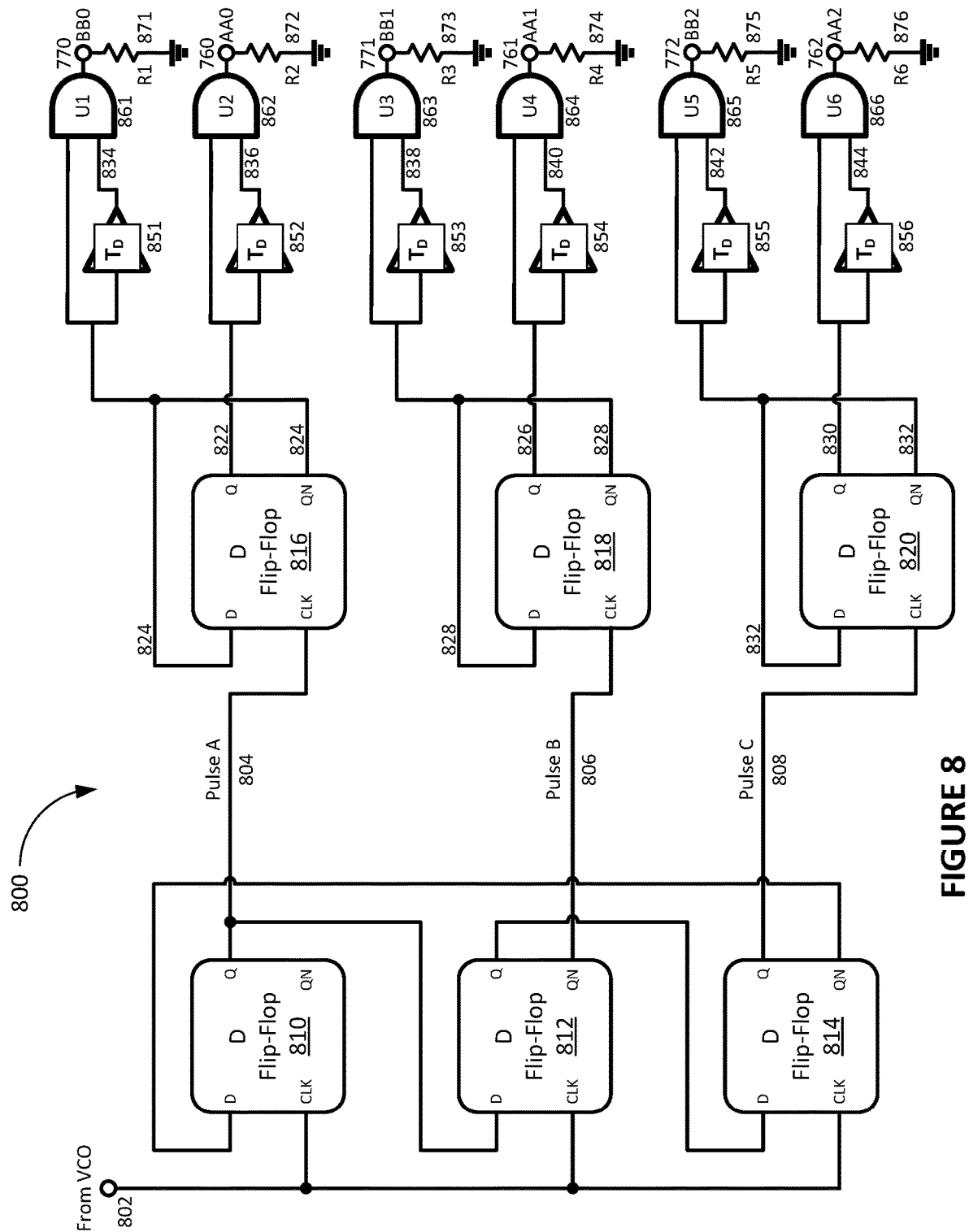
FIG. 8 illustrates an exemplary control circuit for the three-phase power supply circuit of FIG. 7.

FIG. 8 illustrates an exemplary control circuit 800 for the three-phase power supply circuit 700 of FIG. 7. In this example embodiment, a clock signal 802 from a voltage-controlled oscillator (VCO) is provided to the CLK inputs of three D flip-flops 810, 812, and 814 which are configured to divide the frequency of the clock signal 802 by three and provide three pulse signals, each offset from each other in phase by 120 degrees. Pulse A 804 is provided by the Q output of D flip-flop 810, Pulse B 806 is provided by the inverted QN output of D flip-flop 821, and Pulse C 808 is provided by the Q output of D flip-flop 814.

The Q output of D flip-flop 810 is provided to the D input of D flip-flop 812, the Q output of D flip-flop 812 is provided to the D input of D flip-flop 814, and the inverted QN output of D flip-flop 814 is provided to the D input of D flip-flop 810. These three flip-flops thus act to provide the three pulse signals 804, 806, and 808 with 120-degree phase offsets and a frequency equal to ⅓ f the clock signal 802 received from the VCO.

Pulse A 804 is provided to the CLK input of D flip-flop 816. D flip-flop 816 acts to divide the frequency of Pulse A 804 in half. Output Q 822 of D flip-flop 816 drives an input of phase 0 first delay circuit 852 and a first input of phase 0 first AND gate U2 862. The output 836 of phase 0 first delay circuit 852 drives the second input of phase 0 first AND gate U2 862. Inverted output QN 824 of D flip-flop 816 drives the D input of D flip-flop 816 along with an input of phase 0 second delay circuit 851 and a first input of phase 0 second AND gate U1 861. The output 834 of phase 0 second delay circuit 851 drives the second input of phase 0 second AND gate U1 861.

The output of phase 0 first AND gate U2 862 provides control signal AA0 760 to the Phase 0 LLC voltage convertor 711 of FIG. 7 across resistor R2 872. The output of phase 0 second AND gate U1 861 provides control signal BB0 770 to the Phase 0 LLC voltage convertor 711 of FIG. 7 across resistor R1 871.

Pulse B 806 is provided to the CLK input of D flip-flop 818. D flip-flop 818 acts to divide the frequency of Pulse B 806 in half. Output Q 826 of D flip-flop 818 drives an input of phase 1 first delay circuit 854 and a first input of phase 1 first AND gate U4 864. The output 840 of phase 1 first delay circuit 854 drives the second input of phase 1 first AND gate U4 864. Inverted output QN 828 of D flip-flop 818 drives the D input of D flip-flop 818 along with an input of phase 1 second delay circuit 853 and a first input of phase 1 second AND gate U3 863. The output 838 of phase 1 second delay circuit 853 drives the second input of phase 1 second AND gate U3 863.

The output of phase 1 first AND gate U4 864 provides control signal AA1 761 to the Phase 1 LLC voltage convertor 712 of FIG. 7 across resistor R4 874. The output of phase 1 second AND gate U3 863 provides control signal BB1 771 to the Phase 1 LLC voltage convertor 712 of FIG. 7 across resistor R3 873.

Pulse C 808 is provided to the CLK input of D flip-flop 820. D flip-flop 820 acts to divide the frequency of Pulse C 808 in half. Output Q 830 of D flip-flop 820 drives an input of phase 2 first delay circuit 856 and a first input of phase 2 first AND gate U6 866. The output 844 of phase 2 first delay circuit 856 drives the second input of phase 2 first AND gate U6 866. Inverted output QN 832 of D flip-flop 820 drives the D input of D flip-flop 820 along with an input of phase 2 second delay circuit 855 and a first input of phase 2 second AND gate U5 865. The output 842 of phase 2 second delay circuit 855 drives the second input of phase 2 second AND gate U5 865.

The output of phase 2 first AND gate U6 866 provides control signal AA2 762 to the Phase 2 LLC voltage convertor 713 of FIG. 7 across resistor R6 876. The output of phase 2 second AND gate U5 865 provides control signal BB2 772 to the Phase 2 LLC voltage convertor 713 of FIG. 7 across resistor R5 875.

Figure 9:
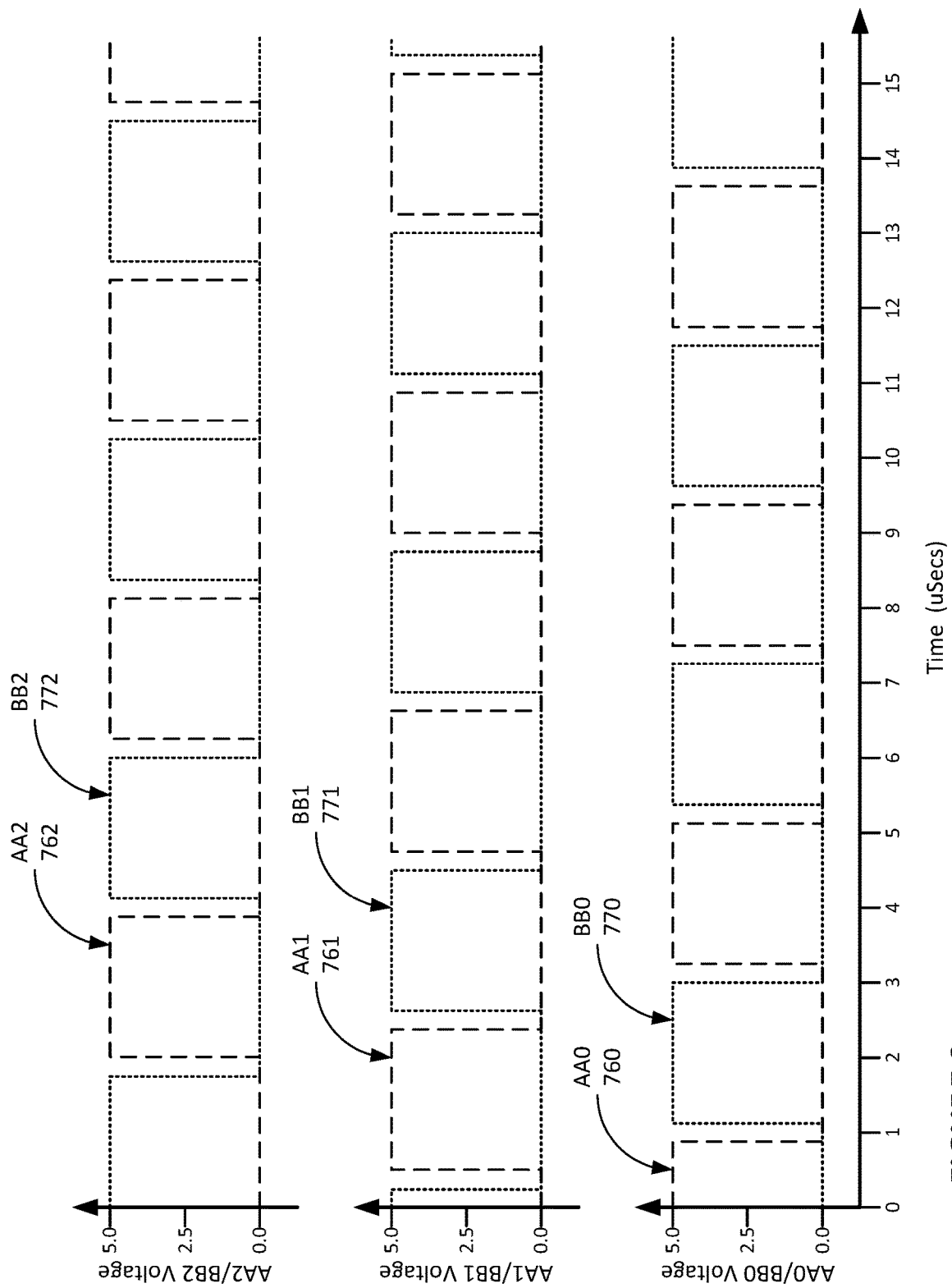
FIG. 9 illustrates exemplary non-overlapping square wave outputs from the control circuit of FIG. 8.

FIG. 9 illustrates exemplary non-overlapping square wave outputs from the control circuit 800 of FIG. 8. This timing diagram illustrates outputs AA0 760 from phase 0 first AND gate U2 862, BB0 770 from phase 0 second AND gate U1 861, AA1 761 from phase 1 first AND gate U4 864, BB1 771 from phase 1 second AND gate U3 863, AA2 762 from phase 2 first AND gate U6 866, and BB3 772 from phase 2 second AND gate U5 865 from FIG. 8.

Note that the voltages and times illustrated here are exemplary, and various embodiments of the present invention may provide square wave control signals of various amplitudes and frequencies all within the scope of the present invention.

Figure 10:
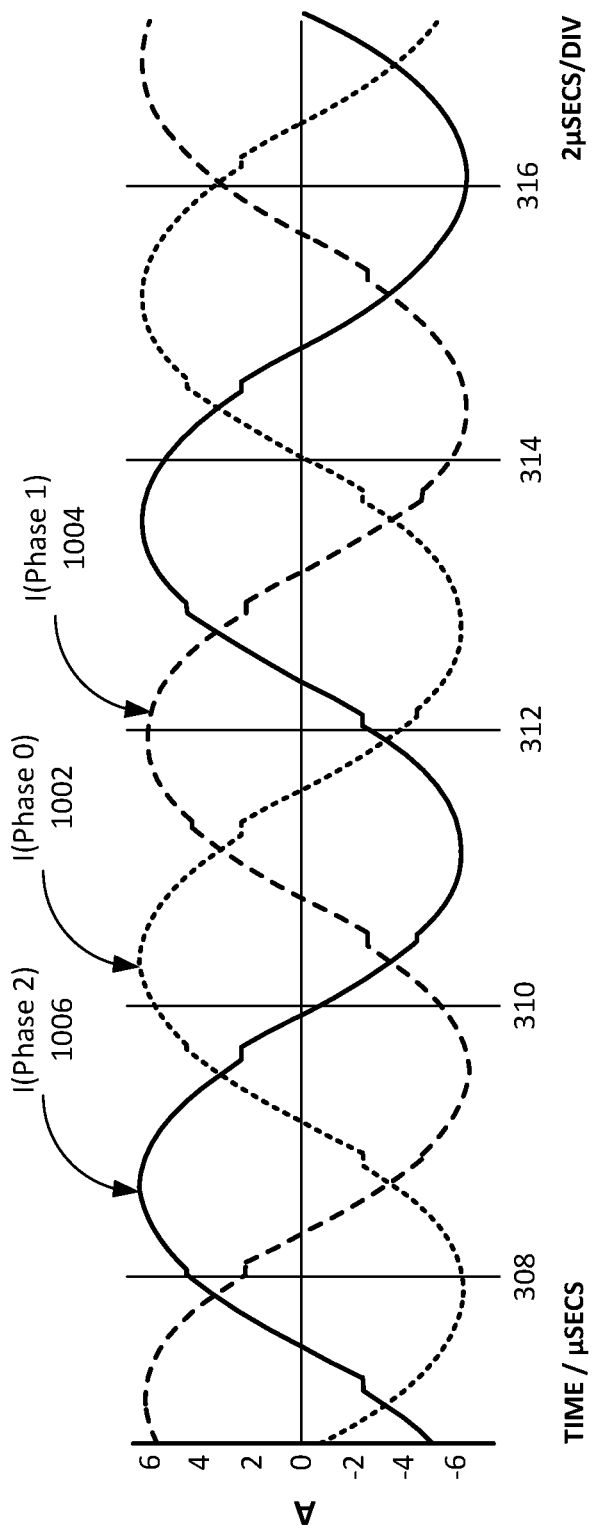
FIG. 10 illustrates exemplary currents within primary coils of the three transformers within the three-phase power supply circuit of FIG. 7.

FIG. 10 illustrates exemplary currents within primary coils of the three transformers within the three-phase power supply circuit 700 of FIG. 7.

Waveform 1002 illustrates the current through the primary coil of transformer TX1 within phase 0 LLC voltage convertor 711. Waveform 1004 illustrates the current through the primary coil of transformer TX1 within phase 1 LLC voltage convertor 712. Waveform 1006 illustrates the current through the primary coil of transformer TX1 within phase 2 LLC voltage convertor 713.

Note that the currents and times illustrated here are exemplary, and various embodiments of the present invention may produce waveforms of various amplitudes and frequencies all within the scope of the present invention.

Figure 11:
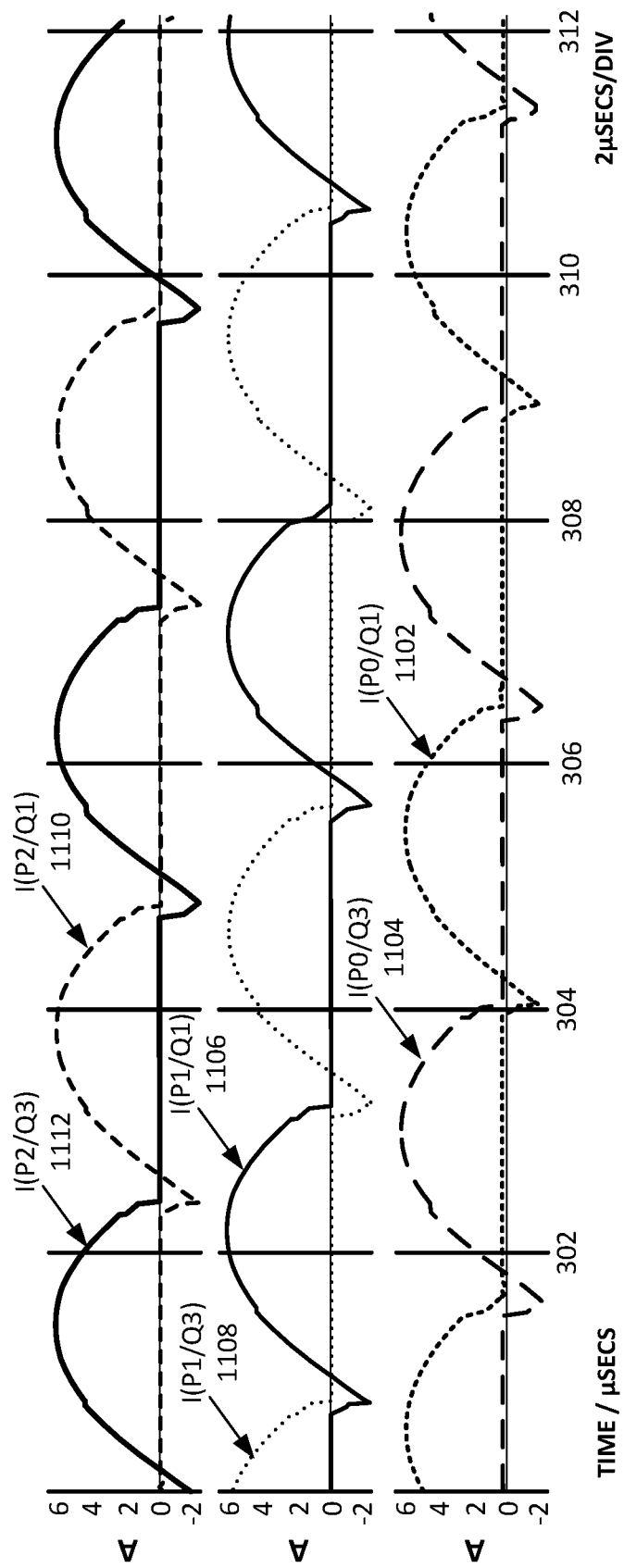
FIG. 11 illustrates exemplary currents within active switches within the three LLC resonant voltage convertors within the three-phase power supply circuit of FIG. 7.

FIG. 11 illustrates exemplary currents within active switches within the three LLC resonant voltage convertors 711, 712, and 713 within the three-phase power supply circuit 700 of FIG. 7.

Waveform 1102 illustrates the current through Q1 641 within phase 0 LLC voltage convertor 711. Waveform 1104 illustrates the current through Q3 643 within phase 0 LLC voltage convertor 711.

Waveform 1106 illustrates the current through Q1 641 within phase 1 LLC voltage convertor 712. Waveform 1108 illustrates the current through Q3 643 within phase 1 LLC voltage convertor 712.

Waveform 1110 illustrates the current through Q1 641 within phase 2 LLC voltage convertor 713. Waveform 1112 illustrates the current through Q3 643 within phase 2 LLC voltage convertor 713.

Note that the currents and times illustrated here are exemplary, and various embodiments of the present invention may produce waveforms of various amplitudes and frequencies all within the scope of the present invention.

Figure 12:
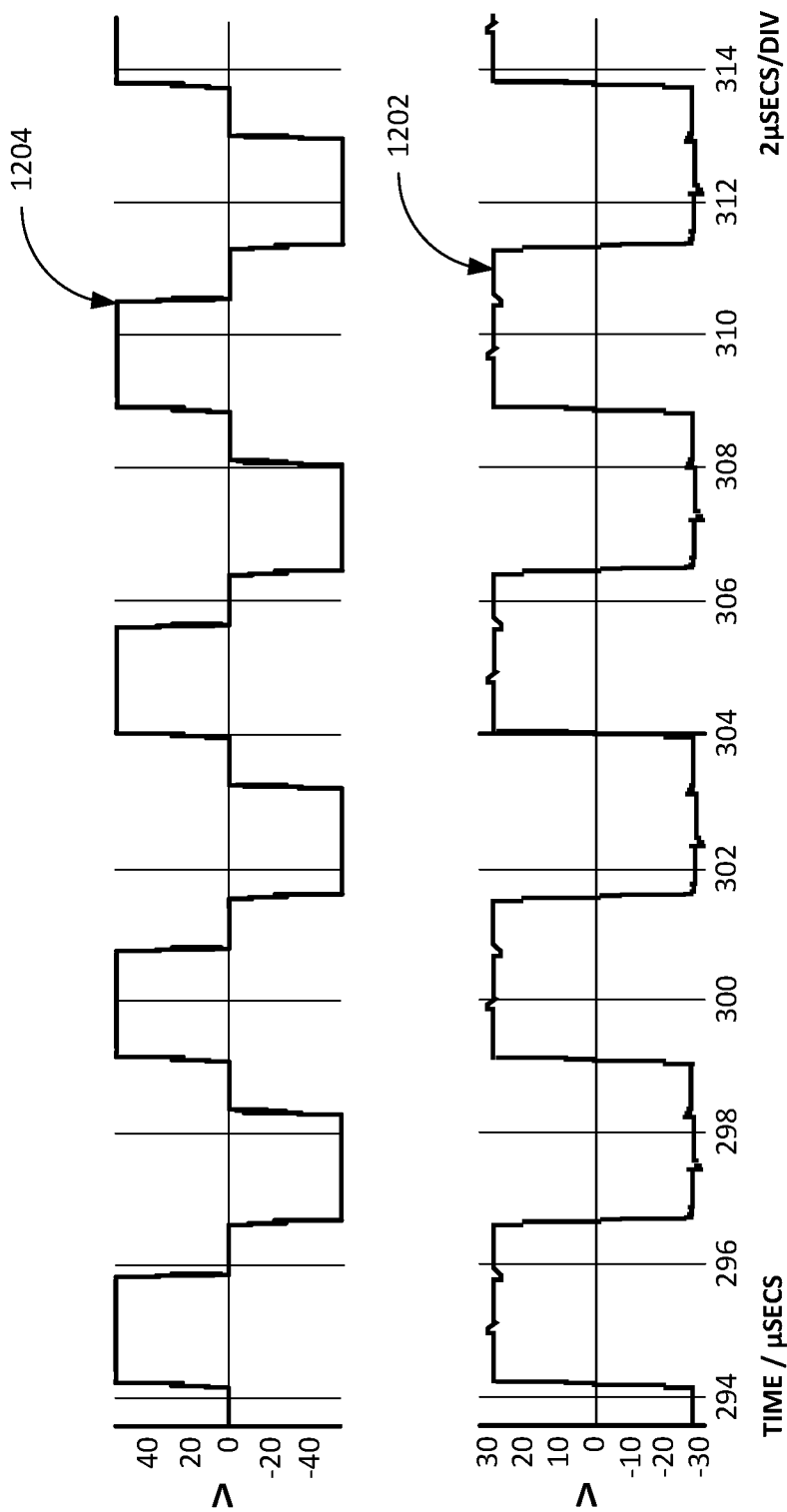
FIG. 12 illustrates exemplary phase-to-phase and phase-to-star point voltages within the secondary coils of the three transformers within the three-phase power supply circuit of FIG. 7.

FIG. 12 illustrates exemplary phase-to-phase and phase-to-star point voltages within the secondary coils of the three transformers within the three-phase power supply circuit 700 of FIG. 7.

Waveform 1202 illustrates the voltage difference between the OUT+ signals of two of the LLC voltage convertors of FIG. 7. Waveform 1204 illustrates the voltage difference between the OUT+ signal and the OUT-signal (connected in a star formation) of one of the LLC voltage convertors of FIG. 7. Note that the phase-to-phase peak voltage of waveform 1202 is equal to the phase-to-star point voltage of waveform 1204.

Note that the voltages and times illustrated here are exemplary, and various embodiments of the present invention may produce waveforms of various amplitudes and frequencies all within the scope of the present invention.

Figure 13:
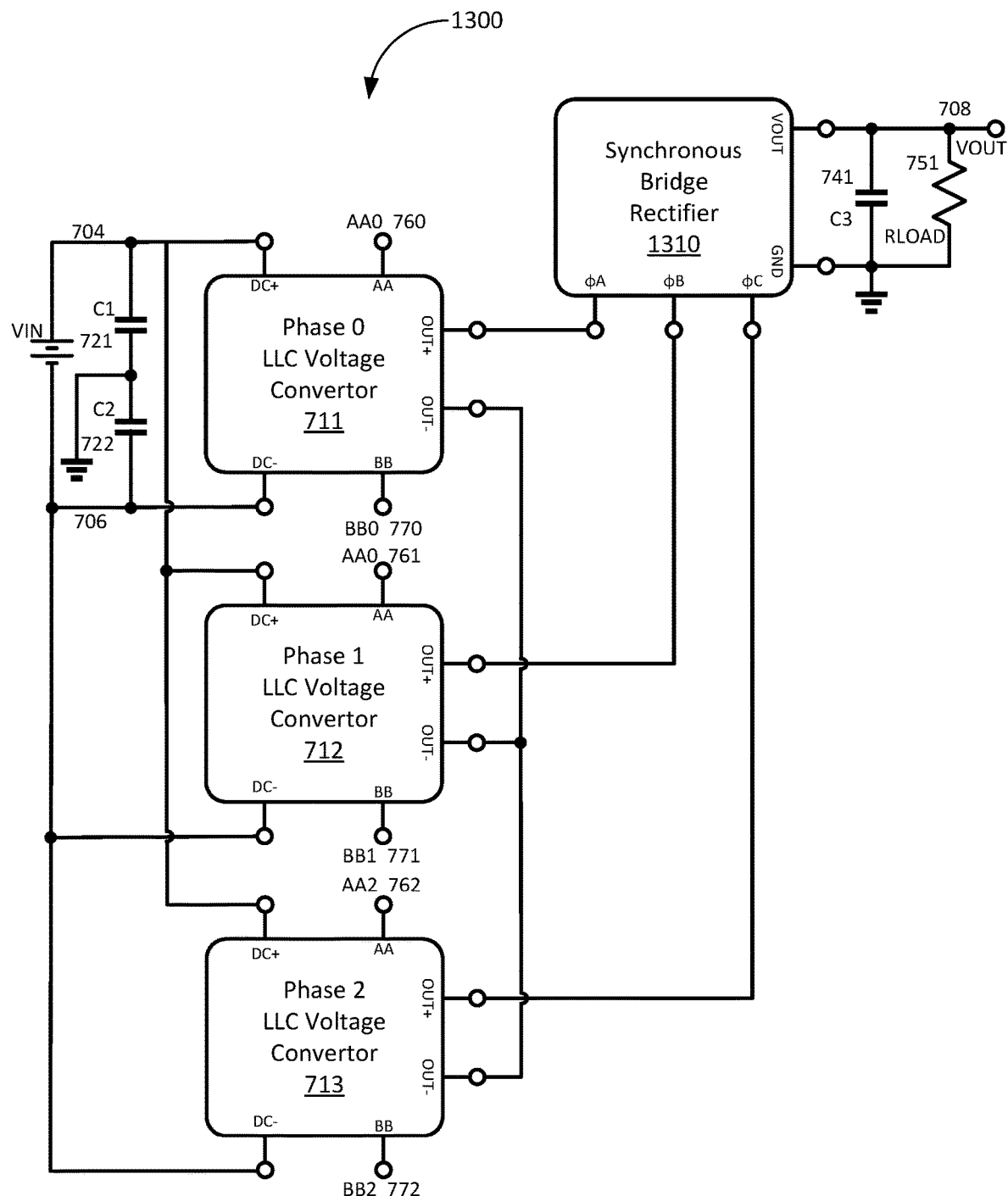
FIG. 13 illustrates an exemplary three-phase power supply circuit including an output filter capacitor.

FIG. 13 illustrates an exemplary three-phase power supply circuit 1300 including an output filter capacitor. This exemplary three-phase power supply circuit 1300 is identical to the three-phase power supply circuit 700, however bridge rectifier 702 has been replaced by synchronous bridge rectifier 1310 which is illustrated in FIG. 14 and described in detail below.

FIG. 14 illustrates an exemplary synchronous bridge rectifier 1310 including six MOSFETs from FIG. 13. In this example embodiment, the rectifier diodes D7-D12 731-736 of bridge rectifier 702 of FIG. 7 have been replaced by MOSFETs Q10-Q15 1410-1415. Synchronous bridge rectifier 1310 provides output VOUT 1404 with reference to ground GND 1405.

The start endings of the step-down transformers of FIG. 13 are connected to the midpoint of each leg of the three-phase synchronous bridge rectifier 1310. OUT+ of phase 0

LLC voltage convertor 711 is coupled to φA 1401, OUT+ of phase 1 LLC voltage convertor 712 is coupled to ΦB 1402, and OUT+ of phase 2 LLC voltage convertor 713 is coupled to ΦC 1403.

The phase A leg of three-phase synchronous bridge rectifier 1310 includes Q10 1410 controlled by syncA 1430, syncA_U 1431, and R10 1420, and Q13 1413 controlled by syncA_N 1432 and R13 1423, with ΦA 1401 provided between Q10 1410 and Q13 1413. The phase B leg of three-phase synchronous bridge rectifier 1310 includes Q11 1411 controlled by syncB 1433, syncB_U 1434, and R11 1421, and Q14 1414 controlled by syncB_N 1435 and R14 1424, with φB 1402 provided between Q11 1411 and Q14 1414. The phase C leg of three-phase synchronous bridge rectifier 1310 includes Q12 1412 controlled by syncC 1437, syncC_U 1438, and R12 1422, and Q15 1415 controlled by syncC_N 1439 and R15 1425, with φC 1403 provided between Q12 1412 and Q15 1415.

Drive signals syncA 1430 and syncA_N 1432 should be in phase with control signals AA0 760 and BB0 770 respectively. Drive signals syncB 1433 and syncB N_1435 should be in phase with control signals AA1 761 and BB1 771 respectively. Drive signals syncC 1436 and syncC_N 1438 should be in phase with control signals AA2 762 and BB0 772 respectively.

In order to avoid reverse current through MOSFETs Q10-Q15 1410-1415 from drain to source, the on time of the synchronous MOSFETs should be less than the resonant half time of the corresponding phase when the switching frequency of the converter is less than or equal to the resonant frequency of the converter. When the switching frequency is higher than the resonant frequency, the on time and the phasing are carefully selected to avoid reverse current. Common commercially available circuits may be used to drive the synchronous rectifiers.

FIG. 15 illustrates an exemplary single-phase LLC resonant voltage convertor 1500 for use within the three-phase power supply circuit 1300 of FIG. 13. This example single-phase LLC resonant voltage convertor 1500 is identical to the single-phase LLC resonant voltage converter 600 of FIG. 6, however step-down transformer TX1 646 of FIG. 6 is provided external to LLC resonant voltage convertor 1500.

In this example embodiment, an input voltage is applied to inputs DC+ 1506 and DC– 1508 of the voltage convertor 1500. In some example embodiments the input voltage may be provided by a power factor correction circuit.

Switch Q1 1541 and diode D1 1531 make up a first half-bridge and switch Q2 1542 and diode D2 1532 make up a second half-bridge. Diodes D1 131 and D2 1532 are blocking diodes which block current when switches Q1 1541 and Q2 1542 are turned on simultaneously. Resistor R10 1557 to ground is included between diodes D1 1531 and D2 1532.

Switch Q1 1541 is driven by isolated driver E1 1521 and resistors R1 1551 and R2 1552. Switch Q2 1542 is driven by isolated driver E3 1522 and resistors R3 1553 and R4 1554. Isolated drivers E1 1521 and E2 1522 are both driven by square wave AA 1502 which is generated by control circuit 800 illustrated in FIG. 8 and described in detail above.

The maximum voltage stress on switches Q1 1541 and Q2 1542 is equal to half of the input voltage between DC+ 1506 and DC– 1508, while switch Q3 1543 experiences the entire voltage stress of the input voltage between DC+ 1506 and DC– 1508. In an example embodiment, when the input voltage between DC+ 1506 and DC– 1508 is 440 volts, switches Q1 1541 and Q2 1542 may be rated for 300-400 volts, while Q3 1543 is rated for 600-650 volts.

Switch Q3 1543 is configured to short diodes D1 1531 and D2 1532 when it is activated by isolated driver E3 1523 and resistors R5 1555 and R6 1556. Isolated driver E3 1523 is driven by square wave BB 1504 which is generated by control circuit 800 illustrated in FIG. 8 and described in detail above.

Each half-bridge drives one node of the primary P1 coil of an external step-down transformer through a capacitor/inductor pair. The first half-bridge comprising switch Q1 1541 and diode D1 1531 drives a first node of the primary P1 coil of the external step-down transformer through split resonant components capacitor C1 1561 and inductor L1 1544, electrically coupled in series. The second half-bridge comprising switch Q2 1542 and diode D2 1532 drives a second node of the primary P1 coil of the external step-down transformer through split resonant components capacitor C2 1562 and inductor L2 1545, electrically coupled in series.

Output voltages OUT+ 1510 and OUT– 1512 are provided to first and second nodes of the primary coil P1 of an external step-down transformer as described above.

In other example embodiments, a single resonant tank comprising C2 1562 and L2 1545 may be used, in which case the value of C2 1562 will be half of the value required by the split arrangement illustrated in FIG. 15, and the value of L2 1545 will be double the value required by the split arrangement illustrated in FIG. 15.

Figure 16:
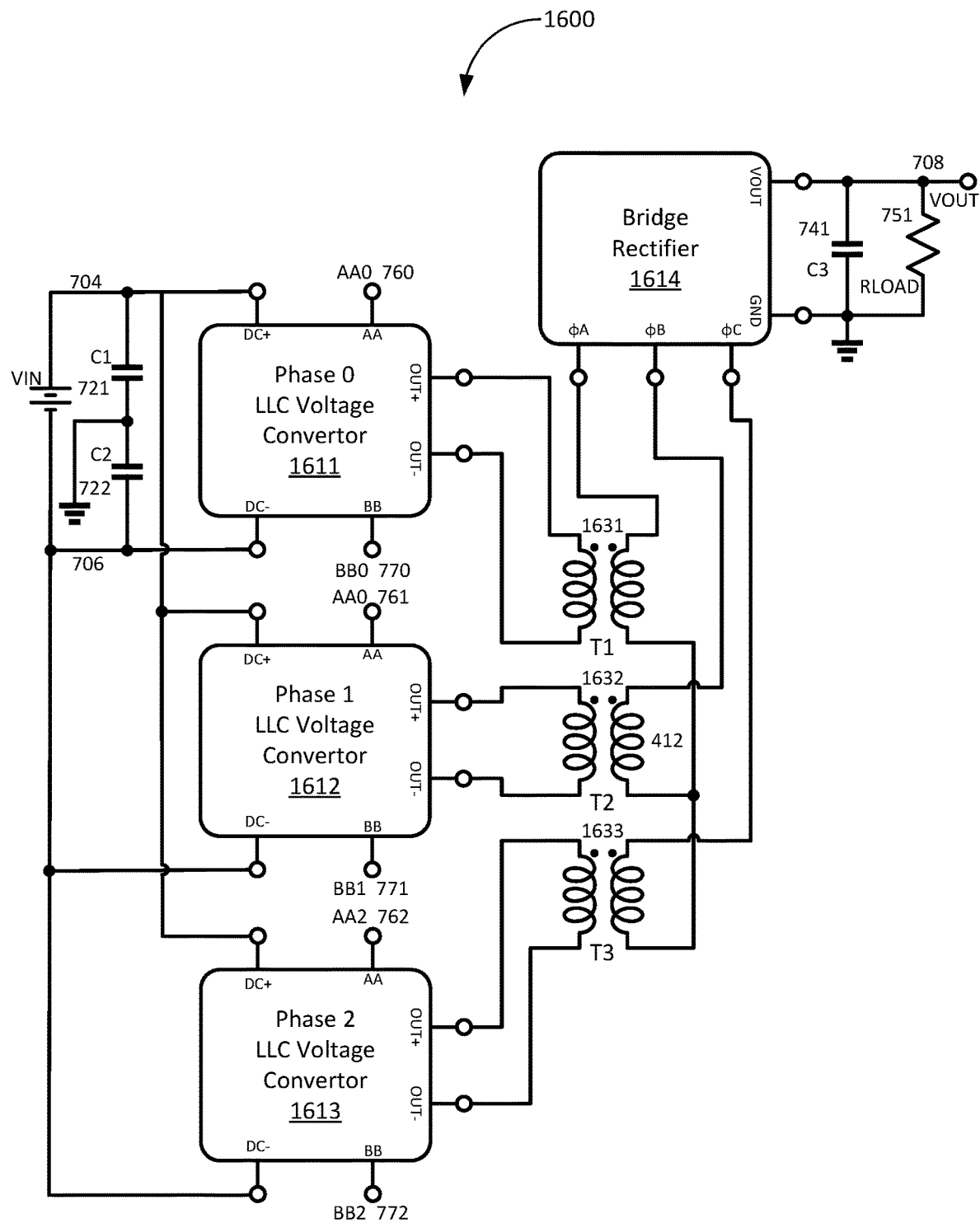
FIG. 16 illustrates an exemplary three-phase power supply circuit with step-down transformers external to the three single-phase LLC resonant voltage convertors.

FIG. 16 illustrates an exemplary three-phase power supply circuit 1600 with step-down transformers external to the three single-phase LLC resonant voltage convertors 1611, 1612, and 1613. This example three-phase power supply circuit 1600 is identical to that illustrated in FIG. 13, however here the three step-down transformers T1 1631, T2 1632, and T3 1633 are provided external to the LLC voltage convertors 1611, 1612, and 1613 which are illustrated by FIG. 15 and described in detail above.

In some example embodiments, step-down transformers T1 1631, T2 1632, and T3 1633 may utilize a unified core body. This embodiment is illustrated in FIGS. 17A, 17B, 18A, and 18B and described in detail below.

Bridge rectifier 1614 may comprise a diode bridge rectifier, such as bridge rectifier 702 of FIG. 7, synchronous bridge rectifier 1310 of FIG. 14, or the like all within the scope of the present invention.

Figure 17A:
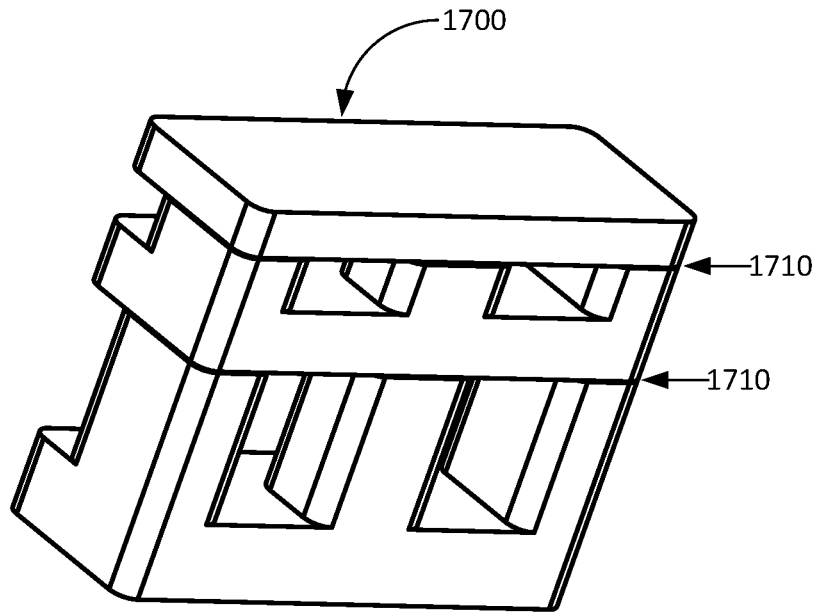
FIGS. 17A and 17B illustrate an exemplary unified core body for a three-phase power supply circuit such as that of FIG. 16.
Figure 17B:
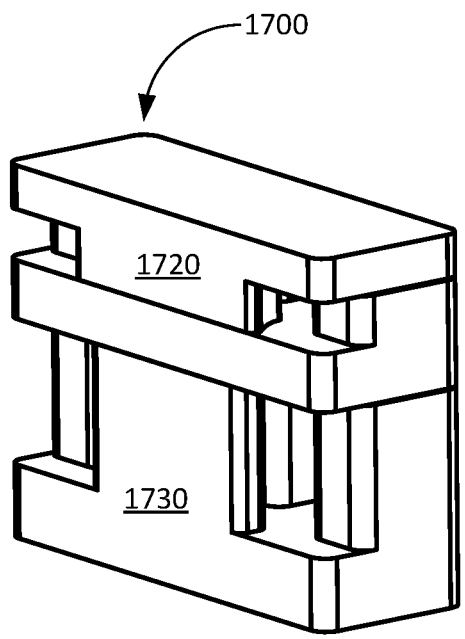

FIGS. 17A and 17B illustrate an exemplary unified core body 1700 for a three-phase power supply circuit such as that of FIG. 16. In these example embodiments, a unified core body 1700 is configured to support three inductors and three transformers which are formed by a plurality of windings. Unified core body 1700 includes air gaps 1710 which influence various parameters of the inductors and transformers supported by the core body 1700. The air gaps 1710 are provided to store magnetizing energy in order to achieve zero-voltage switching (ZVS) for the active switches within the power supply. Unified core body 1700 also includes inductor return leg 1720 and transformer return leg 1730. In this embodiment, the return legs do not require air gaps.

Inductor return leg 1720 provides a return path for magnetic flux from the three inductors. Transformer return leg 1730 provides a return path for magnetic flux from the three transformers.

In an example embodiment, unified core body 1700 has a plurality of core legs (here three are illustrated). Each core leg has a first and second end, which each extend in a direction of central axes of the plurality of windings and around which the plurality of windings are wound such that magnetic fluxes are produced in the plurality of core legs when current flows through the plurality of windings.

Figure 18A:
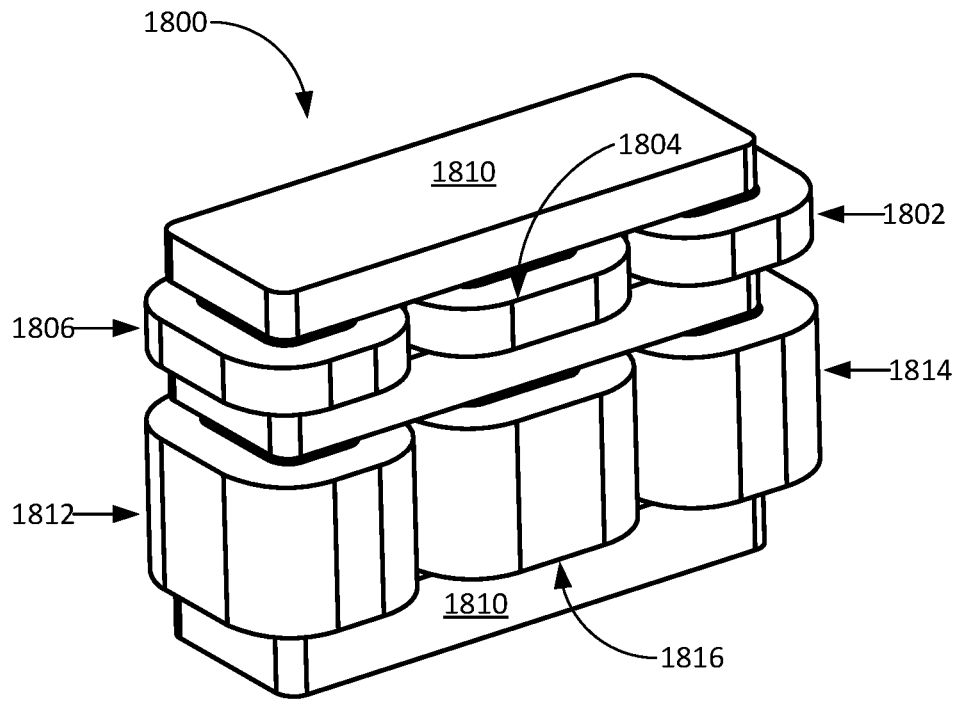
FIGS. 18A and 18B illustrate an exemplary three-phase magnetics assembly including three step-down transformers and three inductors for the three-phase power supply circuit of FIG. 16.
Figure 18B:
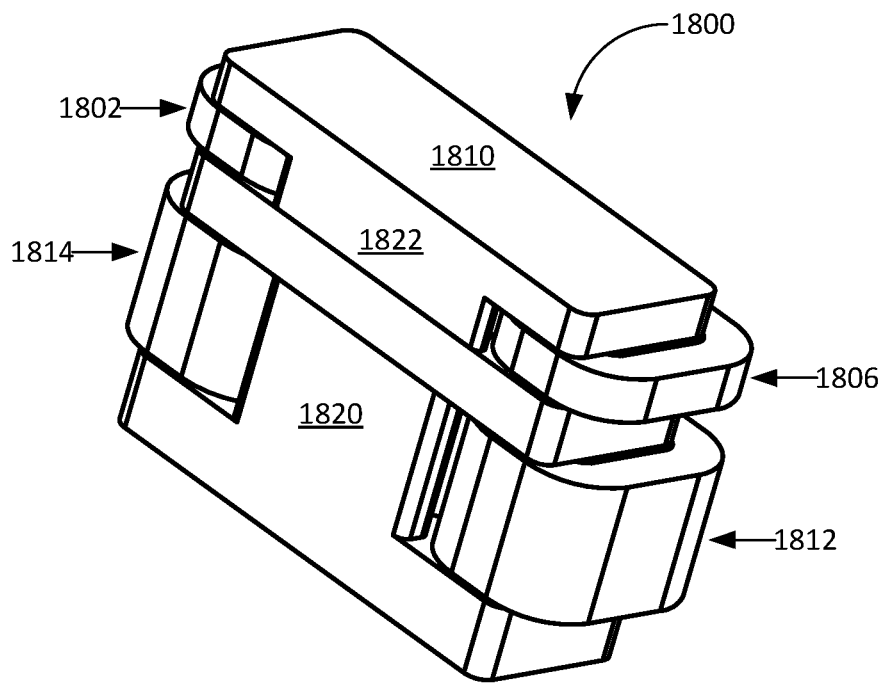

FIGS. 18A and 18B illustrate an exemplary three-phase magnetics assembly 1800 including three step-down transformers and three inductors for the three-phase power supply circuit 1600 of FIG. 16.

In this example embodiment unified core body 1810 has been populated with three transformers 1812, 1814, and 1816, along with three inductors 1802, 1804, and 1806. FIG. 18B also illustrates inductor return leg 1822 and transformer return leg 1820.

Since the inductors and transformers support large currents, each contributes to some amount of core loss from the magnetic flux within their cores. In order to minimize this core loss all three inductors and three transformers are integrated together into three-phase magnetics assembly 1800. A common inductor return leg is provided for the three inductors, and a common transformer return leg 1820 is provided for the three transformers 1812, 1814, and 1816, as illustrated in FIGS. 17A and 17B. Magnetic flux from the three phases within the single return legs 1820 acts to cancel each other out since the phases are separated by 120-degrees, thus reducing core loss within three-phase magnetics assembly 1800.

FIG. 19 illustrates exemplary magnetic fluxes within each of the transformers and inductors and a common return leg within an exemplary power supply circuit incorporating the three-phase magnetics assembly of FIGS. 18A and 18B.

In an example embodiment, magnetic flux from each of the three inductors is sinusoidal and offset by 120-degrees, so that the combined magnetic flux in the return leg from the three inductors cancels itself out to essentially zero in ideal conditions. The magnetic flux in each transformer winding is triangular and offset by 120-degrees, so that the combined magnetic flux from the three transformer phases act to partially cancel each other out, and reduce the magnetic flux within the transformer return leg to ⅓ that of the flux in each individual transformer leg.

FIG. 19 illustrates the relationship between inductor flux and transformer flux within an exemplary power supply circuit incorporating a three-phase magnetics assembly. In an example embodiment, such as that illustrated in FIGS. 18A and 18B, magnetic flux within the three inductors 1802, 1804, and 1806 has a sinusoidal shape, while magnetic flux within the three transformers 1812, 1814, and 1816 has a triangular shape. Each phase is offset by 120 degrees or 2π/3.

Graph 1910 illustrates current within the three inductors 1802, 1804, and 1806. These current waveforms 1911, 1912, and 1913 are sinusoidal in shape and offset by 120 degrees or 2π/3. Graph 1920, comprising waveforms 1921, 1922, and 1923 illustrate the currents through the output rectifier diodes. Graph 1930 illustrates the output voltage VOUT 1931.

Graph 1940 illustrates magnetic fluxes within each of the three transformers and graph 1950 illustrates the magnetic flux within the common return leg within an exemplary power supply circuit incorporating a three-phase magnetics assembly. As discussed above, each transformer has a magnetic flux with a triangular waveform offset from each other by 120 degrees or 2π/3. Here the magnetic flux within first phase transformer T1 1631 is illustrated by waveform 1941, the magnetic flux within second phase transformer T2 1632 is illustrated by waveform 1942, and the magnetic flux within third phase transformer T3 1633 is illustrated by waveform 1943. The magnetic flux through transformer return leg 1820 is illustrated by waveform 1951.

When these three magnetic fluxes are combined within common return leg 1820, the amplitude of the combined fluxes is ⅓ that of each individual transformer with a frequency three time that of the individual transformers. By combining the magnetic fluxes from the three transformers into a single transformer return leg, the amplitude of the flux is reduced by ⅔ and directly reduces core losses in the assembly.

Figure 20:
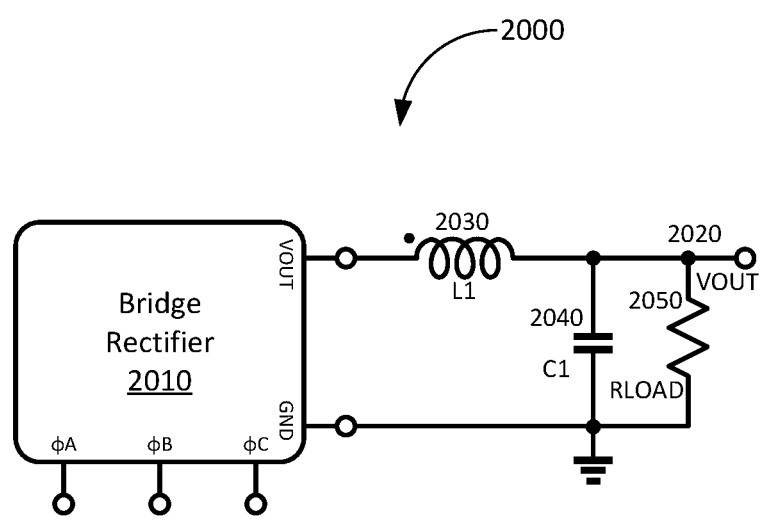
FIG. 20 illustrates a portion of a three-phase power supply circuit including an output inductor.

FIG. 20 illustrates a portion of a three-phase power supply circuit 2000 including an output inductor 2030. This example embodiment may be applied to any of the three-phase power supply circuits described herein.

In this example, bridge rectifier 2010 drives output voltage VOUT 2020 across output filter capacitor C10 2040 driving load resistance RLOAD 2050 through output inductor 2030 which is electrically coupled between the output of bridge rectifier 2010 and output filter capacitor 2040. The addition of output inductor 2030 ensures current balance between the phases of three-phase power supply circuit 2000 in the situation where resonant parameters are mismatched.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above may be combined in various ways to form multiple embodiments. As a result, the invention is not limited to the specific embodiments described above, but only by the claims and their equivalents.

The invention claimed is:

1. A multi-phase power supply circuit comprising:
   a first LLC resonant voltage convertor;
   a second LLC resonant voltage convertor;
   a first step-down transformer comprising:
      a primary coil coupled to the first LLC resonant voltage convertor and having a first node and a second node; and
      a secondary coil having a first node and a second node;
   a second step-down transformer comprising:
      a primary coil coupled to the second LLC resonant voltage convertor and having a first node and a second node; and
      a secondary coil having a first node and a second node;
   a bridge rectifier electrically coupled with the first node of the secondary coil of each of the first and second step-down transformers;
   wherein the second nodes of the secondary coils of each of the first and second step-down transformers are electrically coupled together.

2. The multi-phase power supply circuit of claim 1 further comprising: a third LLC resonant voltage convertor; and a third step-down transformer comprising: a primary coil coupled to the third LLC resonant voltage convertor and having a first node and a second node; and a secondary coil having a first node and a second node; wherein the bridge rectifier electrically is further coupled with the first node of the secondary coil of the third step-down transformer; and wherein the second node of the secondary coil of the third step-down transformer is electrically coupled to the second nodes of the secondary coils of the first and second step-down transformers.

3. The multi-phase power supply circuit of claim 2, wherein the second nodes of the secondary coils of each of the three step-down transformers are electrically coupled in a star configuration.

4. The multi-phase power supply circuit of claim 2, wherein the three step-down transformers are constructed on a unified core body.

5. The multi-phase power supply circuit of claim 2, wherein the three step-down transformers and at least one inductor from each of the three LLC resonant voltage convertors are constructed on a unified core body.

6. The multi-phase power supply circuit of claim 5, wherein the unified core body comprises:
three core legs, each core leg having an air gap.

7. The multi-phase power supply circuit of claim 6, wherein the air gaps are configured such that each core leg stores magnetizing energy to achieve zero-voltage switching (ZVS) for each active switch within the three LLC resonant voltage convertors.

8. The multi-phase power supply circuit of claim 6, wherein the unified core body further comprises:
an inductor return leg, configured to conduct magnetic flux between first and second ends of the core legs within the inductors; and
a transformer return leg, configured to conduct magnetic flux between first and second ends of the core legs within the step-down transformers.

9. The multi-phase power supply circuit of claim 8, wherein currents within the inductors are sinusoidal and magnetic fluxes from each of the three inductors cancel each other within the inductor return leg.

10. The multi-phase power supply circuit of claim 8, wherein currents within the step-down transformers are triangular and magnetic fluxes from each of the three step-down transformers partially cancel each other within the transformer return leg.

11. The multi-phase power supply circuit of claim 2, wherein each LLC resonant voltage convertor comprises:
a pair of input terminals for receiving a voltage input from an input power source;
a pair of output terminals for supplying a direct current (DC) voltage output to a load;
two switches and two diodes coupled in a three-level LLC circuit arrangement between the pair of input terminals and the pair of output terminals, with a first switch and first diode configured as a first half-bridge and a second switch and second diode configured as a second half-bridge;
a third switch coupled across the first and second diodes to short circuit the first and second diodes when the third switch is closed.

12. The multi-phase power supply circuit of claim 11, wherein the bridge rectifier is a synchronous bridge rectifier.

13. The multi-phase power supply circuit of claim 11, further comprising:
a control circuit comprising a voltage-controlled oscillator (VCO) and a plurality of logic gates coupled to the three LLC resonant voltage convertors, and configured to operate the three switches within each of the three LLC resonant voltage convertors.

14. The multi-phase power supply circuit of claim 13, wherein the control circuit includes a non-overlapping square wave generator comprising:
a delay flip-flop wherein a clock input of the flip-flop is electrically coupled with an output of the VCO and an output of the flip-flop is electrically coupled with an input of a first delay circuit and a first input of a first AND gate and an output of the first delay circuit is electrically coupled with a second input of the first AND gate providing a first square wave, and an inverted output of the flip-flop is electrically coupled with an input of a second delay circuit and a first input of a second AND gate and an output of the second delay circuit is electrically coupled with a second input of the second AND gate providing a second square wave which is never high at the same time as the first square wave.

15. The multi-phase power supply circuit of claim 14, wherein the control circuit includes three non-overlapping square wave generators, each configured to control the three switches within one of the three LLC resonant voltage convertors.

16. The multi-phase power supply circuit of claim 15, where the three non-overlapping square wave generators each have a frequency equal to ⅙ of the output of the VCO, and each is configured to provide square waves having a 120-degree phase shift from the other two non-overlapping square wave generators.

17. The multi-phase power supply circuit of claim 15, wherein the non-overlapping square wave generators are configured to create dead times between high pulses of the first and second square waves providing for zero-voltage switching (ZVS) and zero-current switching (ZCS) of the switches within each of the LLC resonant voltage convertors.

18. The multi-phase power supply circuit of claim 11, wherein each LLC resonant voltage convertor further comprises:
a first capacitor and a first inductor electrically coupled in series between the first half-bridge and the primary side of one of the three step-down transformers; and
a second capacitor and a second inductor electrically couple in series between the second half-bridge and the primary side of the one of the three step-down transformers.

19. The multi-phase power supply circuit of claim 13, wherein each of the switches is controlled by an isolated driver receiving control signals from the control circuit.

* * * * *